United States Patent
Aoki

(10) Patent No.: US 11,054,473 B2
(45) Date of Patent: Jul. 6, 2021

(54) STATE ESTIMATION DEVICE AND METHOD FOR FUEL CELL AND FUEL CELL SYSTEM

(71) Applicant: NISSAN MOTOR CO., LTD., Yokohama (JP)

(72) Inventor: Tetsuya Aoki, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 792 days.

(21) Appl. No.: 15/518,317

(22) PCT Filed: Oct. 30, 2014

(86) PCT No.: PCT/JP2014/078985
§ 371 (c)(1),
(2) Date: Apr. 11, 2017

(87) PCT Pub. No.: WO2016/067430
PCT Pub. Date: May 6, 2016

(65) Prior Publication Data
US 2017/0307692 A1    Oct. 26, 2017

(51) Int. Cl.
*G01R 31/36* (2020.01)
*G01R 31/389* (2019.01)
(Continued)

(52) U.S. Cl.
CPC ......... *G01R 31/3648* (2013.01); *G01N 27/02* (2013.01); *G01R 31/389* (2019.01);
(Continued)

(58) Field of Classification Search
CPC ............. G01R 31/3648; G01R 31/389; H01M 8/04649; H01M 8/04679; G01N 27/02
See application file for complete search history.

(56) References Cited

U.S. PATENT DOCUMENTS

| | | | |
|---|---|---|---|
| 6,519,539 B1 * | 2/2003 | Freeman | G01R 27/02 702/65 |
| 2005/0048336 A1 * | 3/2005 | Takebe | H01M 8/04305 429/413 |

(Continued)

FOREIGN PATENT DOCUMENTS

| | | |
|---|---|---|
| EP | 1 923 945 A1 | 5/2008 |
| WO | WO-02/27342 A2 | 4/2002 |
| WO | WO 2010-128555 A1 | 11/2010 |

*Primary Examiner* — Regis J Betsch
*Assistant Examiner* — Jeremy A Delozier
(74) *Attorney, Agent, or Firm* — Foley & Lardner LLP

(57) ABSTRACT

A state estimation device for a fuel cell for generating power upon receiving the supply of anode gas and cathode gas, comprising: an internal impedance measurement unit configured to measure an internal impedance of the fuel cell on the basis of an alternating-current signal of a predetermined frequency output from the fuel cell; a state quantity preliminary estimation value calculation unit configured to calculate a first preliminary estimation value for a state quantity of an electrode obtained from a real component of a measurement value of the internal impedance and a second preliminary estimation value for the state quantity of the electrode obtained from an imaginary component of the measurement value of the internal impedance; and a state quantity final estimation value determination unit configured to determine a final estimation value of the state quantity of the electrode on the basis of the calculated first and second preliminary estimation values.

15 Claims, 13 Drawing Sheets

(51) Int. Cl.
*G01N 27/02* (2006.01)
*H01M 8/04664* (2016.01)
*H01M 8/04537* (2016.01)
*H01M 8/1018* (2016.01)

(52) U.S. Cl.
CPC ... *H01M 8/04649* (2013.01); *H01M 8/04679* (2013.01); *H01M 2008/1095* (2013.01); *H01M 2250/20* (2013.01); *Y02T 90/40* (2013.01)

(56) References Cited

U.S. PATENT DOCUMENTS

| | | | | |
|---|---|---|---|---|
| 2010/0141262 | A1* | 6/2010 | Watanabe | H01M 8/04119 324/430 |
| 2012/0038373 | A1* | 2/2012 | Ikeda | H01M 8/04641 324/691 |
| 2014/0295302 | A1* | 10/2014 | Ishikawa | H01M 8/04119 429/413 |
| 2015/0024295 | A1* | 1/2015 | Hibino | H01M 8/04835 429/413 |
| 2016/0028095 | A1* | 1/2016 | Sakai | G01R 31/367 429/430 |

* cited by examiner

STATE ESTIMATION DEVICE AND METHOD FOR FUEL CELL AND FUEL CELL SYSTEM

TECHNICAL FIELD

The present invention relates to a state estimation device and a state estimation method for fuel cell and a fuel cell system.

BACKGROUND ART

It is known to measure a voltage value and an impedance value of a fuel cell and estimate an abnormality on the basis of these values. For example, a shortage of hydrogen gas in an anode electrode (hydrogen starvation), a shortage of oxygen in a cathode electrode (oxygen starvation), the drying of an electrolyte membrane (dry-out) and the like are considered as abnormalities of the fuel cell.

A hydrogen concentration measurement method for estimating that a hydrogen concentration of an anode is relatively low (i.e. a hydrogen starvation state) when an arc of an internal impedance of a fuel cell drawn in a so-called Cole-Cole plot diagram is relatively large is proposed in WO 2010/128555.

SUMMARY OF INVENTION

It is thought that, if the hydrogen starvation occurs, the value of the internal impedance of the entire fuel cell increases and the arc of the internal impedance certainly becomes larger. However, it cannot be concluded that a relative increase of the arc of the internal impedance is due to the hydrogen starvation. For example, the arc of the internal impedance may become larger also due to a reduction in the oxygen concentration of a cathode in some cases. Thus, it has been difficult to properly estimate a state of the fuel cell by the conventional state estimation method for fuel cell using the internal impedance.

The present invention was developed, focusing on such a problem, and aim to provide state estimation device and method for fuel cell capable of properly estimating a state of a fuel cell. Further, a fuel cell system using this state estimation device is provided in the present invention.

According to one aspect of the present invention, the present invention provides a state estimation device for a fuel cell for generating power upon receiving the supply of anode gas and cathode gas. The state estimation device includes an internal impedance measurement unit configured to measure an internal impedance of the fuel cell on the basis of an alternating-current signal of a predetermined frequency output from the fuel cell. The state estimation device further includes a state quantity preliminary estimation value calculation unit configured to calculate a first preliminary estimation value for a state quantity of an electrode obtained from a real component of a measurement value of the internal impedance and a second preliminary estimation value for the state quantity of the electrode obtained from an imaginary component of the measurement value of the internal impedance. Furthermore, the state estimation device includes a state quantity final estimation value determination unit configured to determine a final estimation value of the state quantity of the electrode on the basis of the calculated first and second preliminary estimation values.

DESCRIPTION OF EMBODIMENTS

Hereinafter, embodiments of the present invention are described with reference to the drawings and the like.

A fuel cell is configured such that an electrolyte membrane is sandwiched by an anode electrode serving as a fuel electrode and a cathode electrode serving as an oxidant electrode. The fuel cell generates power using anode gas containing hydrogen and supplied to the anode electrode and cathode gas containing oxygen and supplied to the cathode electrode. Electrode reactions which proceed in both anode and cathode electrodes are as follows.

Anode electrode: $2H_2 \rightarrow 4H^+ + 4e^-$     (1)

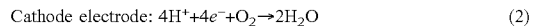

Cathode electrode: $4H^+ + 4e^- + O_2 \rightarrow 2H_2O$     (2)

The fuel cell generates an electromotive force of about 1 V (volt) by these electrode reactions (1) and (2). Here, since the above reactions (1) and (2) are reversible reactions, reactions opposite to the above ones (1) and (2) can be normally caused by applying a voltage having a sign opposite to the one in the case of using the fuel cell while connecting the fuel cell to a load such as by setting a potential of the anode electrode higher than that of the cathode electrode by a predetermined value or larger. Thus, by applying an alternating-current voltage to the fuel cell, the reactions expressed by the above formulae (1) and (2) and the reactions opposite to the former reactions are alternately switched in response to a positive/negative variation of this alternating-current voltage.

Figure 1:
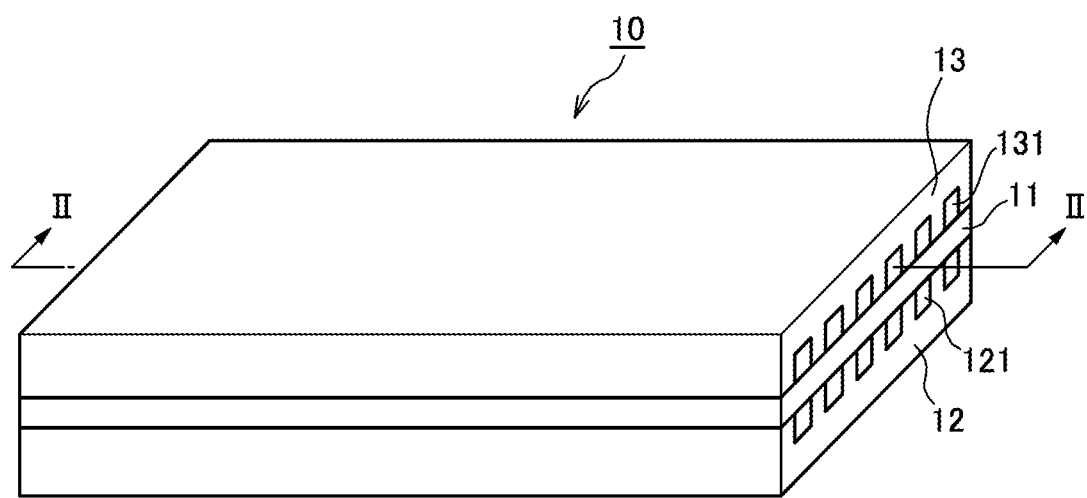
FIG. 1 is a perspective view of a fuel cell according to an embodiment of the present invention.
Figure 2:
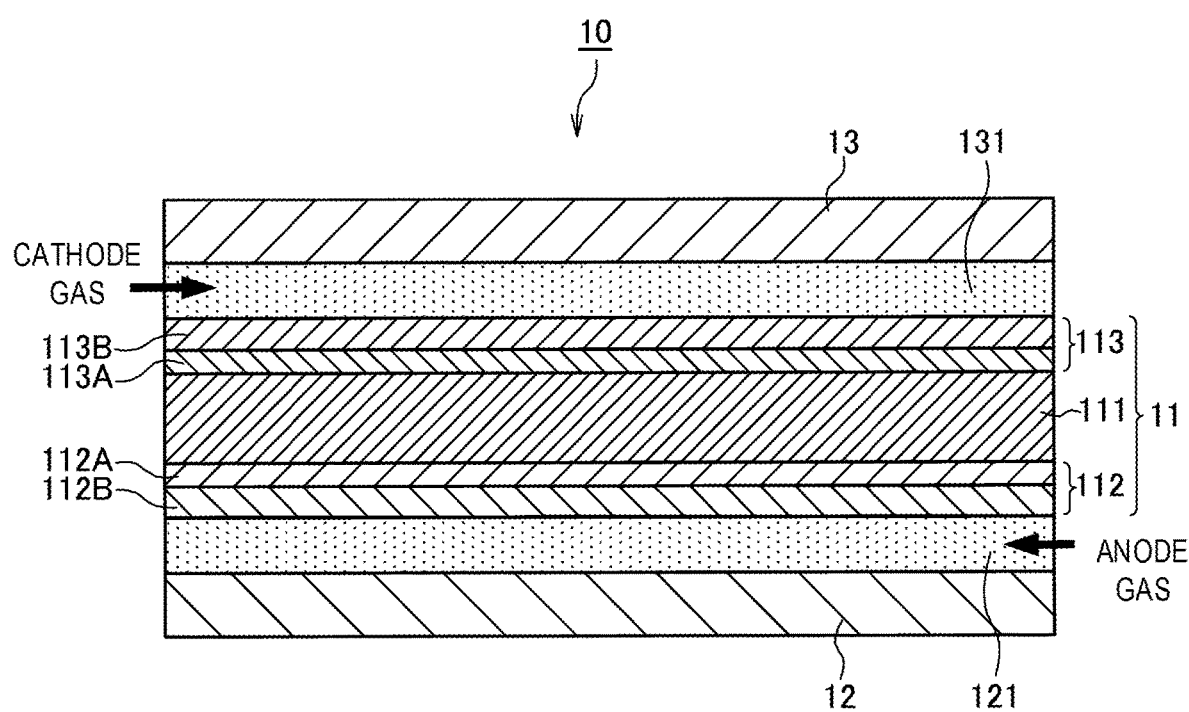
FIG. 2 is a sectional view along II-II of the fuel cell of FIG. 1.

FIGS. 1 and 2 are views showing the configuration of a fuel cell 10 according to one embodiment of the present invention. FIG. 1 is a perspective view of the fuel cell 10. FIG. 2 is a sectional view along II-II of the fuel cell 10 of FIG. 1.

As shown in FIGS. 1 and 2, the fuel cell 10 includes a membrane electrode assembly (MEA) 11, and an anode separator 12 and a cathode separator 13 arranged to sandwich the MEA 11.

The MEA 11 is composed of an electrolyte membrane 111, an anode electrode 112 and a cathode electrode 113. The MEA 11 includes the anode electrode 112 on one surface side of the electrolyte membrane 111 and the cathode electrode 113 on the other surface side.

The electrolyte membrane 111 is a proton conductive ion exchange membrane formed of fluororesin. The electrolyte membrane 111 exhibits good electrical conductivity in a wet state. It should be noted that another material such as a material having a phosphoric acid ($H_3PO_4$) impregnated in a predetermined matrix may be used according to a possible response of the fuel cell.

The anode electrode 112 includes a catalyst layer 112A and a gas diffusion layer 112B. The catalyst layer 112A is a member formed of platinum or carbon black particles carrying platinum or the like and provided in contact with the electrolyte membrane 111. The gas diffusion layer 112B is provided on an outer side of the catalyst layer 112A. The gas diffusion layer 112B is a member formed of carbon cloth having gas diffusion property and electrical conductivity and provided in contact with the catalyst layer 112A and the anode separator 12.

Similarly to the anode electrode 112, the cathode electrode 113 also includes a catalyst layer 113A and a gas diffusion layer 113B. The catalyst layer 113A is arranged between the electrolyte membrane 111 and the gas diffusion layer 113B, and the gas diffusion layer 113B is arranged between the catalyst layer 113A and the cathode separator 13.

The anode separator 12 is arranged on an outer side of the gas diffusion layer 112B. The anode separator 12 includes a plurality of anode gas flow passages 121 for supplying anode gas (hydrogen gas) to the anode electrode 112. The anode gas flow passages 121 are formed as groove-like passages.

The cathode separator 13 is arranged on an outer side of the gas diffusion layer 113B. The cathode separator 13 includes a plurality of cathode gas flow passages 131 for supplying cathode gas (air) to the cathode electrode 113. The cathode gas flow passages 131 are formed as groove-like passages.

The anode separator 12 and the cathode separator 13 are so configured that the anode gas flowing in the anode gas flow passages 121 and the cathode gas flowing in the cathode gas flow passages 131 flow in directions opposite to each other. It should be noted that the anode separator 12 and the cathode separator 13 may be so configured that these gases flow in the same direction.

In the case of using such a fuel cell 10 as a power source for an automotive vehicle, a fuel cell stack in which several hundreds of fuel cells 10 are laminated is used since required power is large. Power for driving the vehicle is taken out by configuring a fuel cell system for supplying anode gas and cathode gas to the fuel cell stack.

It should be noted that, in the present embodiment, an impedance measurement to be described later is conducted for each fuel cell stack in which the fuel cells 10 are laminated, but the impedance measurement may be conducted for each fuel cell 10 or for each part (e.g. several tens of cells) of the fuel cell stack.

Further, in the fuel cell stack, an anode electrode, a cathode electrode and an electrolyte membrane serving as sums are configured by arranging the anode electrodes 112, the cathode electrodes 113 and the electrolyte membranes 111 of a plurality of the fuel cells 10 in series. However, for the convenience of description, these anode electrode, cathode electrode and electrolyte membrane serving as the sums are also denoted by the same reference signs as the anode electrode 112, the cathode electrode 113 and the electrolyte membrane 111 of the single cell.

Figure 3:
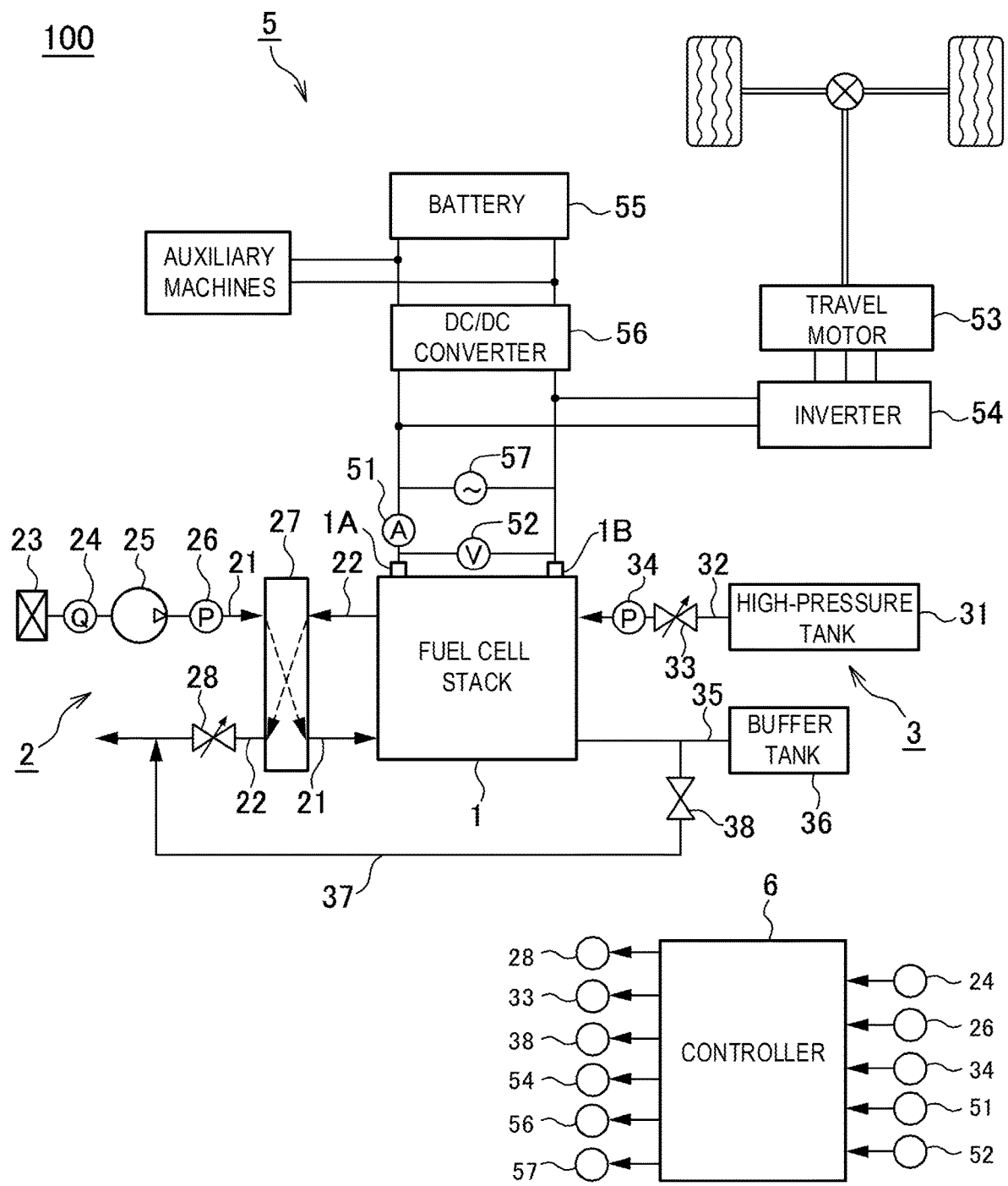
FIG. 3 is a schematic configuration diagram of a fuel cell system according to the embodiment of the present invention.

FIG. 3 is a schematic diagram of a fuel cell system 100 according to one embodiment of the present invention.

The fuel cell system 100 includes a fuel cell stack 1, a cathode gas supplying/discharging device 2, an anode gas supplying/discharging device 3, a power system 5 and a controller 6.

The fuel cell stack 1 is a laminated battery formed by laminating a plurality of fuel cells 10 (unit cells) as described above. The fuel cell stack 1 generates power necessary to drive a vehicle upon receiving the supply of the anode gas and the cathode gas. The fuel cell stack 1 includes an anode electrode side terminal 1A and a cathode electrode side terminal 1B as output terminals for taking out power.

The cathode gas supplying/discharging device 2 supplies the cathode gas to the fuel cell stack 1 and discharges cathode off-gas discharged from the fuel cell stack 1 to outside. The cathode gas supplying/discharging device 2 includes a cathode gas supply passage 21, a cathode gas discharge passage 22, a filter 23, an air flow sensor 24, a cathode compressor 25, a cathode pressure sensor 26, a water recovery device (WRD) 27 and a cathode pressure control valve 28.

The cathode gas supply passage 21 is a passage in which the cathode gas to be supplied to the fuel cell stack 1 flows. One end of the cathode gas supply passage 21 is connected to the filter 23 and the other end is connected to a cathode gas inlet part of the fuel cell stack 1.

The cathode gas discharge passage 22 is a passage in which the cathode off-gas discharged from the fuel cell stack 1 flows. One end of the cathode gas discharge passage 22 is connected to a cathode gas outlet part of the fuel cell stack 1 and the other end is formed as an opening end. The cathode off-gas is mixture gas containing the cathode gas, steam produced by the electrode reaction and the like.

The filter 23 is a member for removing dust, dirt and the like contained in the cathode gas to be taken into the cathode gas supply passage 21.

The cathode compressor 25 is provided downstream of the filter 23 in the cathode gas supply passage 21. The cathode compressor 25 supplies the cathode gas in the cathode gas supply passage 21 to the fuel cell stack 1 by feeding the cathode gas under pressure.

The air flow sensor 24 is provided between the filter 23 and the cathode compressor 25 in the cathode gas supply passage 21. The air flow sensor 24 detects a flow rate of the cathode gas to be supplied to the fuel cell stack 1.

The cathode pressure sensor 26 is provided between the cathode compressor 25 and the WRD 27 in the cathode gas supply passage 21. The cathode pressure sensor 26 detects a pressure of the cathode gas to be supplied to the fuel cell stack 1. The cathode gas pressure detected by the cathode pressure sensor 26 represents a pressure of an entire cathode system including the cathode gas flow passages of the fuel cell stack 1 and the like.

The WRD 27 is connected over the cathode gas supply passage 21 and the cathode gas discharge passage 22. The WRD 27 is a device for recovering moisture in the cathode off-gas flowing in the cathode gas discharge passage 22 and humidifying the cathode gas flowing in the cathode gas supply passage 21 with that recovered moisture.

The cathode pressure control valve 28 is provided downstream of the WRD 27 in the cathode gas discharge passage 22. The cathode pressure control valve 28 is controlled to open and close by the controller 6 and adjusts the pressure of the cathode gas to be supplied to the fuel cell stack 1.

Next, the anode gas supplying/discharging device 3 is described.

The anode gas supplying/discharging device 3 supplies the anode gas to the fuel cell stack 1 and discharges anode off-gas discharged from the fuel cell stack 1 to the cathode gas discharge passage 22. The anode gas supplying/discharging device 3 includes a high-pressure tank 31, an anode gas supply passage 32, an anode pressure control valve 33, an anode pressure sensor 34, an anode gas discharge passage 35, a buffer tank 36, a purge passage 37 and a purge valve 38.

The high-pressure tank 31 is a container for storing the anode gas to be supplied to the fuel cell stack 1 in a high-pressure state.

The anode gas supply passage 32 is a passage for supplying the anode gas discharged from the high-pressure tank 31 to the fuel cell stack 1. One end of the anode gas supply passage 32 is connected to the high-pressure tank 31 and the other end is connected to an anode gas inlet part of the fuel cell stack 1.

The anode pressure control valve 33 is provided downstream of the high-pressure tank 31 in the anode gas supply passage 32. The anode pressure control valve 33 is controlled to open and close by the controller 6 and adjusts a pressure of the anode gas to be supplied to the fuel cell stack 1.

The anode pressure sensor 34 is provided downstream of the anode pressure control valve 33 in the anode gas supply passage 32. The anode pressure sensor 34 detects a pressure of the anode gas to be supplied to the fuel cell stack 1. The anode gas pressure detected by the anode pressure sensor 34 represents a pressure of an entire anode system including the buffer tank 36, the anode gas flow passages of the fuel cell stack 1 and the like.

The anode gas discharge passage 35 is a passage in which the anode off-gas discharged from the fuel cell stack 1 flows. One end of the anode gas discharge passage 35 is connected to an anode gas outlet part of the fuel cell stack 1 and the other end is connected to the buffer tank 36. The anode off-gas contains the anode gas not used in the electrode reaction, impurity gas such as nitrogen having leaked from the cathode gas flow passages 131 to the anode gas flow passages 121, moisture and the like.

The buffer tank 36 is a container for temporarily storing the anode off-gas flowing from the anode gas discharge passage 35. The anode off-gas pooled in the buffer tank 36 is discharged to the cathode gas discharge passage 22 through the purge passage 37 when the purge valve 38 is opened.

The purge passage 37 is a passage for discharging the anode off-gas. One end of the purge passage 37 is connected to the anode gas discharge passage 35 and the other end is connected to a part of the cathode gas discharge passage 22 downstream of the cathode pressure control valve 28.

The purge valve 38 is provided in the purge passage 37. The purge valve 38 is controlled to open and close by the controller 6 and controls a purge flow rate of the anode off-gas discharged from the anode gas discharge passage 35 to the cathode gas discharge passage 22.

When a purge control is executed to open the purge valve 38, the anode off-gas is discharged to outside through the purge passage 37 and the cathode gas discharge passage 22. At this time, the anode off-gas is mixed with the cathode off-gas in the cathode gas discharge passage 22. By mixing the anode off-gas and the cathode off-gas and discharging the mixture gas to outside in this way, an anode gas concentration (hydrogen concentration) in the mixture gas is determined to be a value not larger than a discharge allowable concentration.

The power system 5 includes a current sensor 51, a voltage sensor 52, a travel motor 53, an inverter 54, a battery 55, a DC/DC converter 56 and an alternating-current power supply 57.

The current sensor 51 detects an output current extracted from the fuel cell stack 1. The voltage sensor 52 detects an output voltage of the fuel cell stack 1, i.e. an inter-terminal voltage between the anode electrode side terminal 1A and the cathode electrode side terminal 1B. The voltage sensor 52 may be configured to detect a voltage of each fuel cell 10 or may be configured to detect a voltage of each group composed of a plurality of the fuel cells 10.

The travel motor 53 is a three-phase alternating-current synchronous motor and a drive source for driving wheels. The travel motor 53 has a function serving as a motor to be rotationally driven upon receiving the supply of power from the fuel cell stack 1 and the battery 55 and a function serving as a generator for generating power by being rotationally driven by an external force.

The inverter 54 is composed of a plurality of semiconductor switches such as IGBTs. The semiconductor switches of the inverter 54 are switching-controlled by the controller 6, thereby converting direct-current power into alternating-current power or alternating-current power into direct-current power. The inverter 54 converts composite direct-current power of output power of the fuel cell stack 1 and output power of the battery 55 into three-phase alternating-current power and supplies this power to the travel motor 53 when the travel motor 53 is caused to function as the motor. In contrast, the inverter 54 converts regenerative power (three-phase alternating-current power) of the travel motor 53 into direct-current power and supplies this power to the battery 55 when the travel motor 53 is caused to function as the generator.

The battery 55 is configured to be charged with a surplus of the output power of the fuel cell stack 1 and the regenerative power of the travel motor 53. The power charged into the battery 55 is supplied to the travel motor 53 and auxiliary machines such as the cathode compressor 25 if necessary.

The DC/DC converter 56 is a bidirectional voltage converter for increasing and decreasing the output voltage of the fuel cell stack 1. By controlling the output voltage of the fuel cell stack 1 by the DC/DC converter 56, the output current of the fuel cell stack 1 and the like are adjusted.

The alternating-current power supply 57 is a power supply for applying an alternating-current voltage to the fuel cell stack 1 for the measurement of an internal impedance of the fuel cell stack 1 to be described later, and parameters such as an amplitude, a phase (particularly angular frequency ω) and the like of the alternating-current voltage are controlled by the controller 6. It should be noted that, as a power supply for internal impedance measurement, an alternating current source for supplying an alternating current to the fuel cell stack 1 may be installed in series with the fuel cell stack 1 instead of or in addition to this alternating-current power supply 57. Further, the alternating-current power supply 57 and the alternating current source may be provided in a system different from a path among the terminals 1A, 1B, the inverter 54 and the DC/DC converter 56.

The controller 6 is configured by a microcomputer including a central processing unit (CPU), a read-only memory (ROM), a random access memory (RAM) and an input/output interface (I/O interface). To the controller 6 are input signals from sensors such as an accelerator stroke sensor (not shown) for detecting a depressed amount of an accelerator pedal besides signals from various sensors such as the current sensor 51 and the voltage sensor 52.

The controller 6 adjusts the pressures and flow rates of the anode gas and the cathode gas to be supplied to the fuel cell stack 1 by controlling the anode pressure control valve 33, the cathode pressure control valve 28, the cathode compressor 25 and the like according to an operating state of the fuel cell system 100.

Further, the controller 6 calculates target output power of the fuel cell stack 1 on the basis of the operating state of the fuel cell system 100. Furthermore, the controller 6 calculates the target output power on the basis of power required by the travel motor 53, power required by the auxiliary machines such as the cathode compressor 25, charge/discharge requests of the battery 55 and the like. Particularly, in the present embodiment, the value of the target output power is adjusted according to a final estimation value of a state quantity of the fuel cell stack 1 to be described later.

Further, the controller 6 calculates a target output current of the fuel cell stack 1 on the basis of the target output power calculated as described above by referring to an IV characteristic (current-voltage characteristic) of the fuel cell stack 1 determined in advance. Then, the controller 6 controls the output voltage of the fuel cell stack 1 by the DC/DC converter 56 such that the output current of the fuel cell stack 1 reaches the target output current, and executes a control to supply a necessary current to the travel motor 53 and the auxiliary machines.

Further, the controller 6 controls the cathode compressor 25 and the like such that a degree of wetness (water content) of each electrolyte membrane 111 of the fuel cell stack 1 is in a state suitable for power generation. The controller 6 has a function of calculating an electrolyte membrane resistance of the fuel cell stack 1 correlated with the degrees of wetness of the electrolyte membranes 111. Further, the controller 6 may have a function of controlling the cathode compressor 25 and the like such that the electrolyte membrane resistance has a predetermined target value determined to set a satisfactory degree of wetness of the electrolyte membranes 111.

Furthermore, in the present embodiment, the controller 6 controls the alternating-current power supply 57 to apply an alternating-current voltage of a predetermined frequency to the fuel cell stack 1 in measuring the internal impedance of the fuel cell stack 1. The controller 6 functions as internal impedance measurement unit configured to measure the internal impedance of the fuel cell stack 1 on the basis of the alternating-current voltage of the predetermined frequency applied in this way and a value detected by the current sensor 51 and representing the output alternating current of the fuel cell stack 1 in response to this alternating-current voltage.

More specifically, this controller 6 calculates the internal impedance of the fuel cell stack 1 at the predetermined frequency by dividing a value obtained by performing a Fourier transform on the alternating-current voltage value from the alternating-current power supply 57 (i.e. value measured by the voltage sensor 52) and a value obtained by performing a Fourier transform on an output alternating-current voltage value received from the current sensor 51.

Further, the controller 6 functions as state quantity preliminary estimation value calculation unit configured to calculate a first preliminary estimation value for a state quantity of the electrode obtained from a real component of a measurement value of the internal impedance and a second preliminary estimation value for the state quantity of the electrode obtained from an imaginary component of the measurement value of the internal impedance and state quantity final estimation value determination unit configured to determine the final estimation value of the fuel cell stack 1 on the basis of each calculated preliminary estimation value. It should be noted that the calculation of each preliminary estimation value and the determination of the final estimation value on the basis of these preliminary estimation values are described in detail later.

Figure 4:
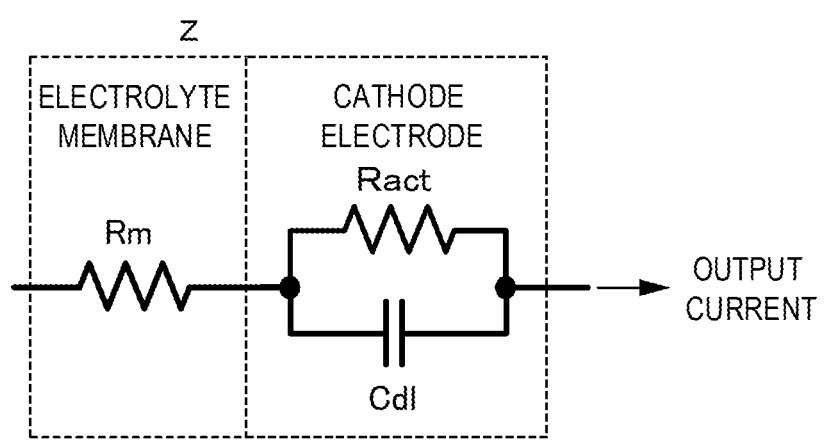
FIG. 4 is a diagram showing an equivalent circuit model of a fuel cell stack employed in the embodiment of the present invention.

FIG. 4 is a diagram showing an equivalent circuit of the fuel cell stack 1.

The equivalent circuit of the fuel cell stack 1 according to the present embodiment can be thought to be composed of an electrolyte membrane resistance $R_m$, which is a resistance component of the electrolyte membrane 111 of the fuel cell stack 1, and a reaction resistance $R_{act}$ and an electrical double layer capacitance $C_{dl}$ of the cathode electrode 113 as shown in FIG. 4. Specifically, in the equivalent circuit according to the fuel cell stack 1 of the present embodiment, the reaction resistance component and the electrical double layer capacitance component in the anode electrode 112 are ignored.

A first reason for that is, for example, as follows. Since the value of the reaction resistance on the side of the anode electrode 112 is very small when an anode gas concentration in the anode gas flow passages is suitable for power generation, even if the reaction resistance value of the anode electrode 112 is ignored unlike the reaction resistance value $R_{act}$ of the cathode electrode 113, it does not largely influence an actual equivalent circuit model.

Further, since the value of the reaction resistance on the side of the anode electrode 112 is very small as just described, a current very easily flows to the reaction resistance on the side of the anode electrode 112 in the case of applying an alternating-current voltage to the fuel cell stack 1. Specifically, this means that a current hardly flows to the electrical double layer capacitance arranged in parallel with this reaction resistance. Thus, even if the electrical double layer capacitance component of the anode electrode 112 is ignored at the time of the impedance measurement, it does not largely influence the actual equivalent circuit model.

For the above reason, constant accuracy can be maintained even if the influence of the anode electrode 112 is ignored in the equivalent circuit model of the fuel cell stack 1. Thus, each preliminary estimation value is calculated and the final estimation value is determined below on the premise of the equivalent circuit model of the fuel cell stack 1 shown in FIG. 4.

Further, it is generally known that there is a relationship of $\omega=2\pi f$ between a "frequency f" and an "angular frequency $\omega$", and there is only a difference multiplied by a dimensionless constant $2\pi$ between these. Thus, the "frequency" and the "angular frequency" are identified with each other and a symbol "ω" is used in expressing the both to facilitate description below.

First Embodiment

Figure 5:
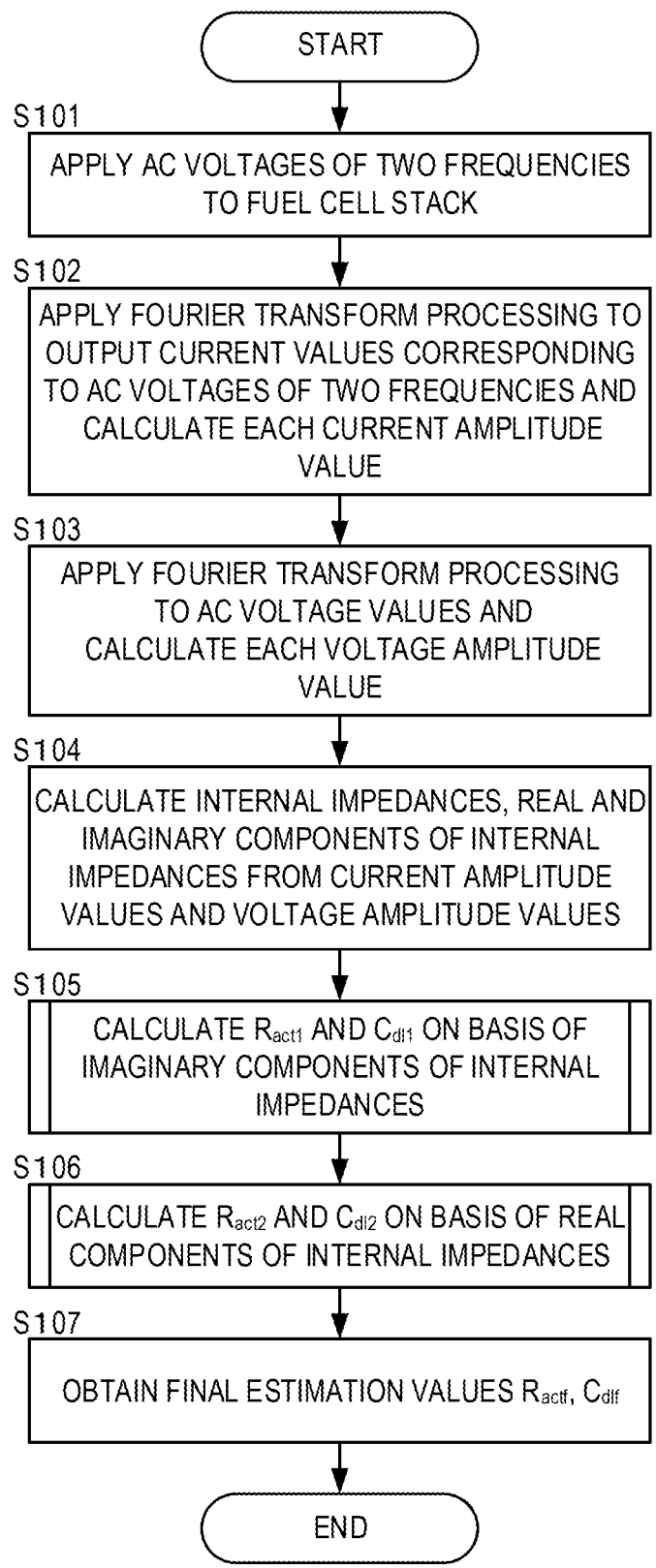
FIG. 5 is a flow chart showing the flow of determining final estimation values indicating a state of a fuel cell stack according to a first embodiment.

FIG. 5 is a flow chart showing the flow of state estimation of the fuel cell stack 1 according to a first embodiment. It should be noted that Steps S101 to S104 below constitute an internal impedance measurement step, Steps S105 and S106 constitute a state quantity preliminary estimation value calculation step and Step S107 constitutes a state quantity final estimation value calculation step.

As shown, the controller 6 first causes the alternating-current power supply 57 to apply alternating-current voltages $V_{in1}$ and $V_{in2}$ of two different frequencies $\omega_1$ and $\omega_2$ selected from a predetermined frequency band (e.g. several Hz to several kHz) to the fuel cell stack 1 at an internal impedance measurement timing in Step S101.

In Step S102, the controller 6 performs a Fourier transform processing on current values $I_{out1}$ and $I_{out2}$ of output currents respectively corresponding to the alternating-current voltages $V_{in1}$ and $V_{in2}$ and measured by the current sensor 51 to calculate current amplitude values $I_{out}(\omega_1)$ and $I_{out}(\omega_2)$.

In Step S103, the controller 6 performs a Fourier transform processing on the alternating-current voltages $V_{in1}$ and $V_{in2}$ of the frequencies $\omega_1$ and $\omega_2$ to calculate voltage amplitude values $V_{out}(\omega_1)$ and $V_{out}(\omega_2)$.

In Step S104, the controller 6 calculates internal impedances $Z_1$, $Z_2$ by dividing the above voltage amplitude values $V_{out}(\omega_1)$ and $V_{out}(\omega_2)$ by the current amplitude values $I_{out}(\omega_1)$ and $I_{out}(\omega_2)$ for the respective frequencies $\omega_1$ and $\omega_2$, and calculates imaginary components $Z_{im1}$ and $Z_{im2}$ and real components $Z_{re1}$ and $Z_{re2}$ of the internal impedances $Z_1$ and $Z_2$.

In Step S105, a first preliminary estimation value $R_{act1}$ of a reaction resistance and a first preliminary estimation value $C_{dl1}$ of an electrical double layer capacitance of a fuel cell are calculated on the basis of the imaginary components $Z_{im1}$ and $Z_{im2}$ of the internal impedances $Z_1$ and $Z_2$. A specific procedure of this calculation is described below.

Figure 6:
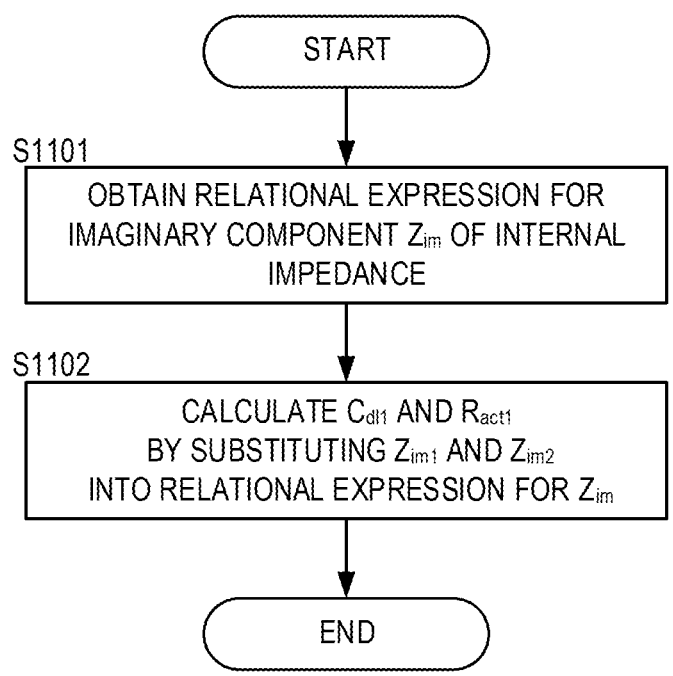
FIG. 6 is a flow chart showing the detail of the calculation of preliminary estimation values $R_{act1}$ and $C_{dl1}$ on the basis of imaginary components $Z_{im}$ of internal impedances Z.

FIG. 6 is a flow chart showing the detail of the calculation of the first and second preliminary estimation values $R_{act1}$ and $C_{dl1}$ on the basis of the imaginary components $Z_{im1}$ and $Z_{im2}$ of the internal impedances Z.

In Step S1101, a relational expression for the imaginary component $Z_{im}$ of the internal impedance is obtained on the basis of the equivalent circuit model of the fuel cell stack 1.

First, an equation based on the equivalent circuit model of the fuel cell stack 1 shown in FIG. 4 is as follows.

[Equation 1]

$$Z = R_m + \frac{R_{act}(1 - j\omega C_{dl} R_{act})}{1 + \omega^2 C_{dl}^2 R_{act}^2} \quad (1)$$

Where Z denotes the internal impedance of the fuel cell stack 1, j denotes an imaginary unit, w denotes an angular frequency of an alternating-current signal, $R_m$ denotes an electrolyte membrane resistance value, $R_{act}$ denotes a reaction resistance value of a cathode electrode 113 and $C_{dl}$ denotes an electrical double layer capacitance of the cathode electrode 113.

If this Equation (1) is changed by taking the imaginary components on both sides and rewriting $C_{dl}$ into $C_{dl1}$ and $R_{act}$ into $R_{act1}$, the following relational expression for the imaginary component $Z_{im}$ of the internal impedance is obtained.

[Equation 2]

$$-\frac{1}{\omega Z_{im}} = \frac{1}{\omega^2 C_{dl1} R_{act1}^2} + C_{dl1} \quad (2)$$

In Step S1102, an equation with $R_{act1}$ and $C_{dl1}$ serving as unknowns is obtained by substituting the frequencies $\omega_1$, $\omega_2$ and the imaginary components $Z_{im1}$ and $Z_{im2}$ of the internal impedances obtained in Step S104 into the above Equation (2), and is solved.

Particularly, if two points are plotted at two frequencies $\omega_1$, $\omega_2$ on a coordinate system with $-1/\omega Z_{im}$ represented on a vertical axis and $1/\omega^2$ represented on a horizontal axis for the above Equation (2), a straight line is drawn and a gradient and an intercept of this straight line are obtained, this gradient becomes equal to $1/(C_{dl1} \cdot R_{act1}^2)$ and the intercept becomes equal to $C_{dl1}$. Thus, the first preliminary estimation value $C_{dl1}$ of the electrical double layer capacitance can be obtained as the value of the intercept. Further, the first preliminary estimation value $R_{act1}$ of the reaction resistance can be obtained by the obtained first preliminary estimation value $C_{dl1}$ and the value of the gradient.

Referring back to FIG. 5, in Step S106, the controller 6 calculates a second preliminary estimation value $R_{act2}$ of the reaction resistance and a second preliminary estimation value $C_{dl2}$ of the electrical double layer capacitance on the basis of the real components $Z_{re}$ of the internal impedances Z.

Figure 7:
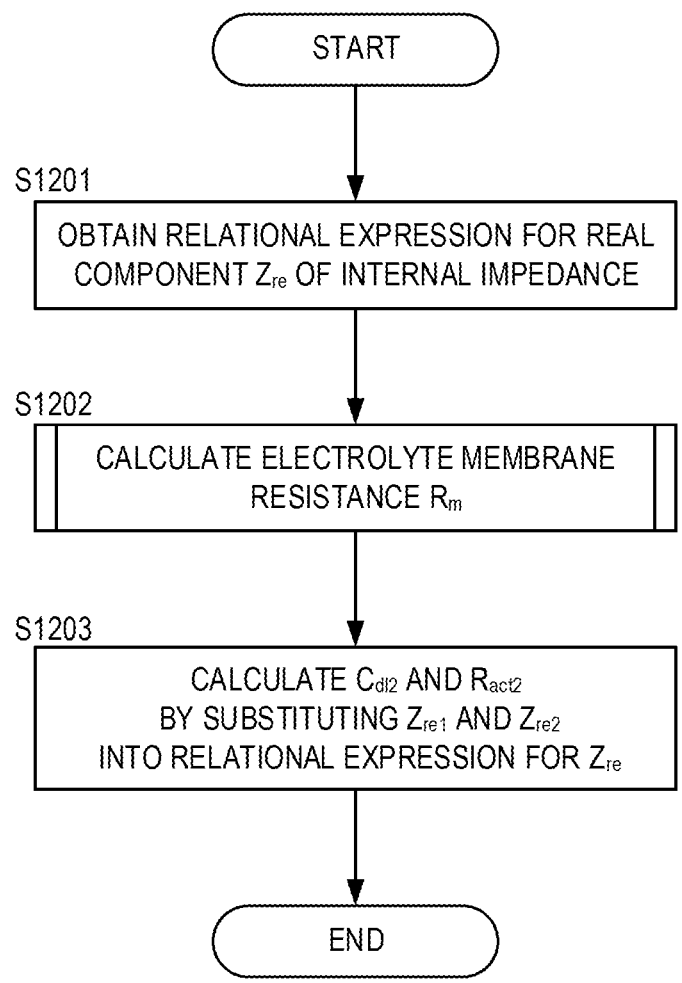
FIG. 7 is a flow chart showing the flow of calculating a preliminary estimation value $R_{act2}$ and a preliminary estimation value $C_{dl2}$ of an electrical double layer capacitance based on real components $Z_{re}$ of the internal impedances.

FIG. 7 is a flow chart showing the detail of the calculation of the second preliminary estimation values $R_{act2}$ and $C_{dl2}$ on the basis of the real components $Z_{re}$ of the internal impedances.

As shown, in Step S1201, a relational expression for the real component $Z_{re}$ of the internal impedance Z is obtained on the basis of the equivalent circuit model of the fuel cell stack 1.

Specifically, if the above Equation (1) is changed by taking the real components on both sides and rewriting $C_{dl}$ into $C_{dl2}$ and $R_{act}$ into $R_{act2}$, the following relational expression for the real component $Z_{re}$ of the internal impedance is obtained.

[Equation 3]

$$\frac{1}{Z_{re} - R_m} = \omega^2 C_{dl2}^2 R_{act2} + \frac{1}{R_{act2}} \quad (3)$$

Here, since the second preliminary estimation value $C_{dl2}$ of the electrical double layer capacitance, the second preliminary estimation value $R_{act2}$ of the reaction resistance and the electrolyte membrane resistance $R_m$ are unknown in the above Equation (3), the electrolyte membrane resistance $R_m$ needs to be obtained in addition to the real components $Z_{re1}$ and $Z_{re2}$ obtained in Step S104 in order to obtain the second preliminary estimation value $R_{act2}$ of the reaction resistance. Thus, the electrolyte membrane resistance $R_m$ is obtained in the next Step S1202.

Figure 8:
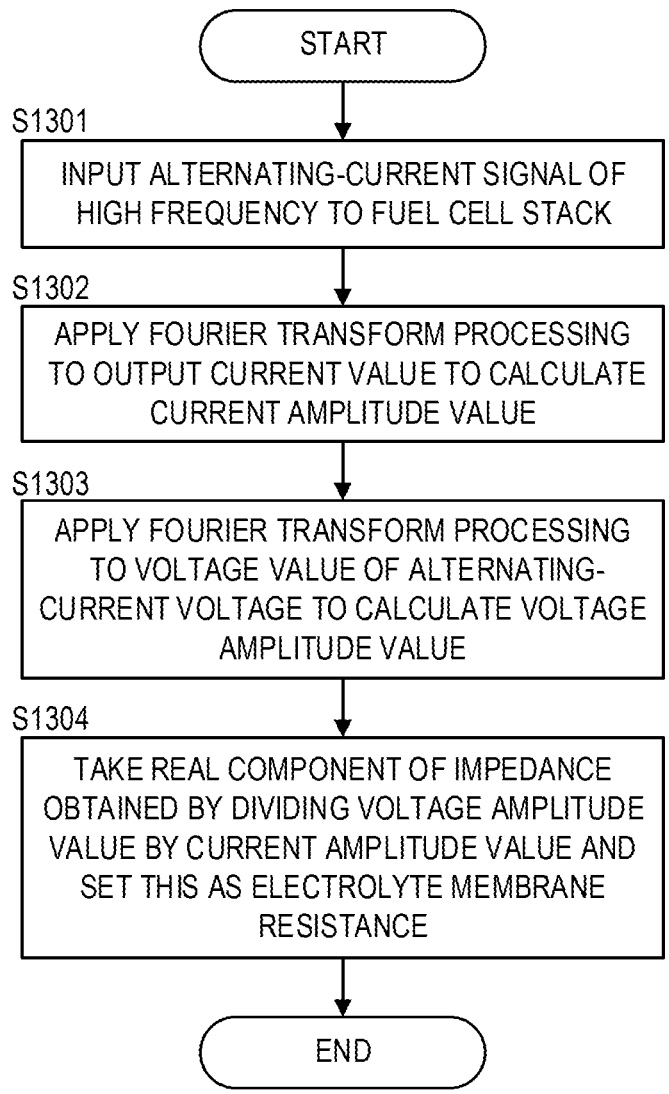
FIG. 8 is a flow chart showing the flow of calculating an electrolyte membrane resistance.

FIG. 8 is a flow chart showing the flow of measuring the electrolyte membrane resistance $R_m$ (this measurement is also written as an HFR measurement below). It should be noted that this HFR measurement may be conducted along with the above internal impedance measurement, but it is assumed in the present embodiment that the HFR measurement is separately conducted in advance for the reason of confirming the degree of wetness of the electrolyte membrane 111 or the like.

In Step S1301, the controller 6 causes the alternating-current power supply 57 to apply an alternating-current voltage $V_{in}$ of a high frequency $\omega_\infty$ (several kHz to several tens of kHz) to the fuel cell stack 1 at an internal impedance measurement timing.

In Step S1302, the controller 6 applies a Fourier transform processing to a current value $I_{out}$ of an output current corresponding to the above alternating-current voltage $V_{in}$ measured by the current sensor 51 to calculate a current amplitude value $I_{out}(\omega_\infty)$.

In Step S1303, the controller 6 applies a Fourier transform processing to the alternating-current voltage yin to calculation a voltage amplitude value $V_{out}(\omega_\infty)$.

In Step S1304, the internal impedance Z is calculated by dividing the voltage amplitude value $V_{out}(\omega_\infty)$ by the current value $I_{out}(\omega_\infty)$ and a real component thereof is determined as the electrolyte membrane resistance $R_m$ of the fuel cell stack 1.

It should be noted that $\omega \to \infty$ is assumed and the value of the second term on the right side of Equation (1) can be approximated substantially to 0 if the frequency has a sufficiently large value in the order of several kHz or higher at the internal impedance of the fuel cell stack 1 expressed by Equation (1) of the above equivalent circuit model. Thus, if the frequency is in the order of several tens of kHz or higher, the real component $Z_{re}$ of the internal impedance Z substantially matches the value $R_m$ of the electrolyte membrane resistance, wherefore the highly accurate value $R_m$ of the electrolyte membrane resistance can be obtained by this measurement.

Referring back to FIG. 7, in Step S1203, two frequencies $\omega_1$ and $\omega_2$, the real components $Z_{re1}$ and $Z_{re2}$ of the internal impedances and the calculated electrolyte membrane resistance $R_m$ are substituted into the above Equation (3), whereby an equation with $C_{dl2}$ and $R_{act2}$ serving as unknowns is obtained and solved.

Particularly, if two points at two frequencies $\omega_1$ and $\omega_2$ are plotted on a coordinate system with $1/(Z_{re}-R_m)$ represented on a vertical axis and $\omega^2$ represented on a horizontal axis, a straight line is drawn and a gradient and an intercept of this straight line are obtained, this gradient becomes equal to $C_{dl2}{}^2-R_{act2}$ and the intercept becomes equal to $1/R_{act2}$. Thus, $R_{act2}$ can be obtained from the value of the intercept and $C_{dl2}$ can be calculated from the obtained $R_{act2}$ and the value of the gradient.

It should be noted that, as a method for obtaining the above electrolyte membrane resistance $R_m$, the real components $Z_{re}$ of the internal impedances may be measured at three frequencies $\omega_1$, $\omega_2$ and $\omega_3$ and these frequencies $\omega_1$, $\omega_2$ and $\omega_3$ and the measurement values of $Z_{re}$ may be substituted into Equation (3) and an obtained equation with $C_{dl2}$, $R_{act2}$ and $R_m$ serving as unknowns may be solved instead of the HFR measurement in Steps S1301 to S1303. In this way, the second preliminary estimation value $C_{dl2}$ of the electrical double layer capacitance and the second preliminary estimation value $R_{act2}$ of the reaction resistance can be calculated without conducting the HFR measurement.

Referring back to FIG. 5, in Step S107, a final estimation value $R_{actf}$ of the reaction resistance and a final estimation value $C_{dlf}$ of the electrical double layer capacitance are calculated on the basis of the calculated first and second preliminary estimation values $R_{act1}$ and $R_{act2}$ of the reaction resistance and first and second preliminary estimation values $C_{dl1}$ and $C_{dl2}$ of the electrical double layer capacitance.

Specifically, the final estimation value $R_{actf}$ of the reaction resistance is determined as $\text{Max}\{R_{act1}, R_{act2}\}$ and the final estimation value Calf of the electrical double layer capacitance is determined as $\text{Min}\{C_{dl1}, C_{dl2}\}$. $\text{Max}\{x, y\}$ means the larger one of the values of x and y (either one of x and y if x=y). Further, $\text{Min}\{x, y\}$ means the smaller one of the values of x and y (either one of x and y if x=y). It should be noted that the calculation of the final estimation value $R_{actf}$ of the reaction resistance and the final estimation value $C_{dlf}$ is not limited to this method. For example, another calculation method such as $R_{actf}=(R_{act1}+R_{act2})/2$, $C_{dlf}=(C_{dl1}+C_{dl2})/2$ may be employed.

The final estimation values $R_{actf}$ and $C_{dlf}$ obtained by each process as described above satisfactorily approximate to actual values of the reaction resistance and the electrical double layer capacitance of the fuel cell stack 1. Particularly, it is known that the value of the reaction resistance tends to become larger, whereas the electrical double layer capacitance tends to become smaller in the event of a certain abnormality in the fuel cell stack 1.

Accordingly, by determining the final estimation value $R_{actf}$ of the reaction resistance as $\text{Max}\{R_{act1}, R_{act2}\}$ and the final estimation value $C_{dlf}$ of the electrical double layer capacitance as $\text{Min}\{C_{dlf}, C_{dl2}\}$, a sufficient margin to quickly detect an abnormal state can be ensured in an operation control of the fuel cell stack 1 using the final estimation values ($R_{actf}$, $C_{dlf}$) as one of control parameters.

According to the controller 6 (state estimation device) of the present embodiment described above and the fuel cell system 100 including this controller, the following effects can be obtained.

The controller 6 functions as the internal impedance measurement unit configured to measure the internal impedance Z of the fuel cell stack 1 on the basis of the alternating-current signals ($I_{out1}$, $I_{out2}$) of the predetermined frequencies ($\omega_1$, $\omega_2$) output from the fuel cell stack 1. Further, the controller 6 functions as the state quantity preliminary estimation value calculation unit configured to calculate the first preliminary estimation value ($R_{act1}$, $C_{dl1}$) for the state quantity of the cathode electrode 113 serving as an electrode obtained from the imaginary components $Z_{im}$ of the measurement values ($Z_1$, $Z_2$) of the internal impedances and the second preliminary estimation value ($R_{act2}$, $C_{dl2}$) for the state quantity of the cathode electrode 113 obtained from the real components $Z_{re}$ of the measurement values ($Z_1$, $Z_2$) of the internal impedances. Furthermore, the controller 6 functions as the state quantity final estimation value determination unit configured to determine the final estimation value ($R_{actf}$, $C_{dlf}$) of the state quantity of the fuel cell stack 1 on the basis of the first preliminary estimation value ($R_{act1}$, $C_{dl1}$) and second preliminary estimation value ($R_{act2}$, $C_{dl2}$).

According to this, as described with respect to Step S107 shown in FIG. 5, the final estimation value ($R_{actf}$, $C_{dlf}$) for estimating the state of the fuel cell stack 1 is determined using the first preliminary estimation value ($R_{act1}$, $C_{dl1}$) and the second preliminary estimation value ($R_{act2}$, $C_{dl2}$) respectively calculated from the internal impedance imaginary components $Z_{im}$ and the internal impedance real components $Z_{re}$, which are components independent of each other. Thus, this final estimation value ($R_{actf}$, $C_{dlf}$) is a highly accurate value matching the state of the fuel cell stack 1. As a result, if this final estimation value ($R_{actf}$, $C_{dlf}$) is used as a control parameter, a suitable operation control of the fuel cell stack can be executed.

Particularly, by taking Max{$R_{act1}$, $R_{act2}$} and Min{$C_{dl1}$, $C_{dl2}$} for the first preliminary estimation values ($R_{act1}$, $C_{dl1}$) and the second preliminary estimation values ($R_{act2}$, $C_{dl2}$) to determine the final estimation values $R_{actf}$, $C_{dlf}$ by the controller 6 as in the present embodiment, calculation for determining the final estimation values $R_{actf}$, $C_{dlf}$ is facilitated.

Particularly, in the event of a certain abnormality in the fuel cell stack 1, the value of the reaction resistance tends to become larger. Thus, by setting Max{$R_{act1}$, $R_{act2}$}, which is the larger one of the first and second preliminary estimation values $R_{act1}$ and $R_{act2}$ of the reaction resistance value, as the final estimation value $R_{actf}$ as described above, it is possible to execute a conservative control of the fuel cell stack 1 to quickly detect an abnormal state of the fuel cell stack 1.

Further, in obtaining the first preliminary estimation value $R_{act1}$ of the reaction resistance value of the fuel cell stack 1, the frequencies $\omega_1$, $\varphi_2$ and the measurement values $Z_{im1}$ and $Z_{im2}$ of the imaginary components of the internal impedances corresponding to these frequencies $\omega_1$, $\omega_2$ are used in accordance with the above Equation (2). In this way, the first preliminary estimation value $R_{act1}$ can be more reliably obtained.

Particularly, it is preferred that two points are plotted on a coordinate system with $1/\omega^2$ represented on a horizontal axis and $-1/(\omega \cdot Z_{im})$ represented on a vertical axis, using the frequencies $\omega_1$ and $\omega_2$ and the measurement values $Z_{im1}$ and $Z_{im2}$ of the imaginary components of the internal impedances corresponding to these frequencies $\omega_1$ and $\omega_2$, a gradient and an intercept of a straight line obtained by connecting these two points are calculated and the first preliminary estimation value $R_{act1}$ is obtained on the basis of the calculated gradient and intercept.

In this way, the first preliminary estimation value $R_{act1}$ can be easily calculated at a high speed from the above gradient and intercept without obtaining other parameters such as the electrolyte membrane resistance $R_m$. It should be noted that the number of plot points on the aforementioned coordinate system may be three or more. By taking three or more plot points, a highly accurate straight line more matching actual values is obtained, with the result that the accuracy of the final estimation value $R_{actf}$ finally obtained using the first preliminary estimation value $R_{act1}$ is more improved.

Further, in obtaining the second preliminary estimation value $R_{act2}$ of the reaction resistance value, the frequencies $\omega_1$, $\omega_2$, the measurement values $Z_{re1}$ and $Z_{re2}$ of the real components of the internal impedances corresponding to these frequencies $\omega_1$, $\omega_2$ and the electrolyte membrane resistance $R_m$ calculated in advance are used in accordance with the above Equation (3). In this way, the second preliminary estimation value $R_{act2}$ can be more reliably obtained.

Particularly, it is preferred that two points are plotted on a coordinate system with $\omega^2$ represented on a horizontal axis and $1/(Z_{re}-R_m)$ represented on a vertical axis, using the frequencies $\omega_1$ and $\omega_2$, the measurement values $Z_{re1}$ and $Z_{re2}$ of the real components of the internal impedances corresponding to these frequencies $\omega_1$ and $\omega_2$ and the electrolyte membrane resistance $R_m$ calculated in advance, an intercept of a straight line obtained by connecting these two points is calculated and the second preliminary estimation value $R_{act2}$ is obtained on the basis of the calculated intercept.

In this way, in the calculation of the second preliminary estimation value $R_{act2}$ using the real components $Z_{re}$ of the internal impedances, the electrolyte membrane resistance $R_m$ can be utilized as it is such as when the electrolyte membrane resistance $R_m$ is calculated in advance to grasp a state such as degrees of wetness of the electrolyte membranes 111 thought to largely influence properties of the fuel cell stack 1. By utilizing the electrolyte membrane resistance $R_m$ calculated in advance as it is in this way, the second preliminary estimation value $R_{act2}$ can be easily calculated at a high speed.

Further, the controller 6 sets the smaller one of the first and second preliminary estimation values $C_{dl1}$ and $C_{dl2}$ of the electrical double layer capacitance, i.e. Min{$C_{dl1}$, $C_{dl2}$} as the final estimation value $C_{dlf}$ in the case of using the electrical double layer capacitance as the state quantity of the cathode electrode 113.

According to this, in the event of a certain abnormality in the fuel cell stack 1, it is possible to execute a conservative control of the fuel cell stack 1 to quickly detect an abnormal state of the fuel cell stack 1 by setting the smaller one of the first and second preliminary estimation values $C_{dl1}$ and $C_{dl2}$ as the final estimation value $C_{dlf}$ of the electrical double layer capacitance since the electrical double layer capacitance of the fuel cell stack 1 tends to become smaller.

Further, in obtaining the first preliminary estimation value Can of the electrical double layer capacitance of the fuel cell stack 1, the first preliminary estimation value $C_{dl1}$ of the electrical double layer capacitance is obtained using the frequencies $\omega_1$, $\omega_2$ and the measurement values $Z_{im1}$ and $Z_{im2}$ of the imaginary components of the internal impedances corresponding to these frequencies $\omega_1$, $\omega_2$ in accordance with the above Equation (2). In this way, the first preliminary estimation value Can of the electrical double layer capacitance can be more reliably obtained.

Particularly, it is preferred that two points are plotted on a coordinate system with $1/\omega^2$ represented on a horizontal axis and $-1/(\omega \cdot Z_{im})$ represented on a vertical axis, using the frequencies $\omega_1$ and $\omega_2$ and the measurement values $Z_{im1}$ and $Z_{im2}$ of the imaginary components of the internal impedances corresponding to these frequencies $\omega_1$ and $\omega_2$, an intercept of a straight line obtained by connecting these two points is calculated and the first preliminary estimation value $C_{dl1}$ is obtained on the basis of the calculated intercept.

In this way, the first preliminary estimation value $C_{dl1}$ can be easily calculated at a high speed from the above gradient and intercept without obtaining other parameters such as the electrolyte membrane resistance $R_m$. It should be noted that the number of plot points on the aforementioned coordinate system may be three or more. By taking three or more plot points and determining a straight line using an approximation method such as a least squares method, a highly accurate straight line more matching actual values is obtained, with the result that the accuracy of the final estimation value $C_{dlf}$ finally obtained using the first and second preliminary estimation values $C_{dl1}$, $C_{dl2}$ is more improved.

Further, in obtaining the second preliminary estimation value $C_{dl2}$ of the electrical double layer capacitance of the fuel cell stack 1, the second preliminary estimation value $C_{dl2}$ of the electrical double layer capacitance is obtained using the frequencies $\omega_1$, $\omega_2$, the measurement values $Z_{re2}$ and $Z_{re2}$ of the real components of the internal impedances corresponding to these frequencies $\omega_1$, $\omega_2$ and the electrolyte membrane resistance $R_m$ calculated in advance in accordance with the above Equation (3). In this way, the second preliminary estimation value $C_{dl2}$ of the electrical double layer capacitance can be more reliably obtained.

Particularly, it is preferred that two points are plotted on a coordinate system with $\omega^2$ represented on a horizontal axis and $1/(Z_{re}-R_m)$ represented on a vertical axis, using the frequencies $\omega_1$ and $\omega_2$, the measurement values $Z_{re1}$ and $Z_{re2}$ of the real components of the internal impedances corresponding to these frequencies $\omega_1$ and $\omega_2$ and the electrolyte membrane resistance $R_m$ calculated in advance, a gradient and an intercept of a straight line obtained by connecting these two points are calculated and the second preliminary estimation value $C_{dl2}$ of the electrical double layer capacitance is obtained on the basis of the calculated gradient and intercept.

According to this, in the calculation of the second preliminary estimation value $C_{dl2}$, the electrolyte membrane resistance $R_m$ can be utilized such as when the electrolyte membrane resistance $R_m$ is calculated in advance to grasp a state such as degrees of wetness of the electrolyte membranes 111 thought to largely influence the properties of the fuel cell stack 1. By utilizing the electrolyte membrane resistance $R_m$ calculated in advance as it is in this way, the second preliminary estimation value $C_{dl2}$ can be easily calculated at a high speed.

Second Embodiment

A second embodiment is described below. It should be noted that elements similar to those of the first embodiment are denoted by the same reference signs and not described.

In the present embodiment, particularly, the first and second preliminary estimation values $R_{act1}$ and $R_{act2}$ of the reaction resistance obtained in the first embodiment are compared with each other and the first and second preliminary estimation values $C_{dl1}$ and $C_{dl2}$ of the electrical double layer capacitance are compared with each other. Final estimation values of the reaction resistance value and the electrical double layer capacitance are determined as parameters of an operation control of a fuel cell stack 1 on the basis of these comparison results, and the operation control of the fuel cell stack 1 is executed on the basis of these.

Specifically, if the above first and second preliminary estimation values substantially match each other, it is judged that a state quantity in the fuel cell stack 1 can be normally estimated and final estimation values obtained by applying a predetermined calculation to each preliminary estimation value are employed as they are.

On the other hand, unless the above first and second preliminary estimation values substantially match each other, it is judged that the state quantity in the fuel cell stack 1 cannot be normally estimated. In this case, since the accuracy of the final estimation values obtained by applying the predetermined calculation to each preliminary estimation value as described above are thought to be low, a process is performed to determine other alternative final estimation values. The process according to this embodiment is described in detail below.

Figure 9:
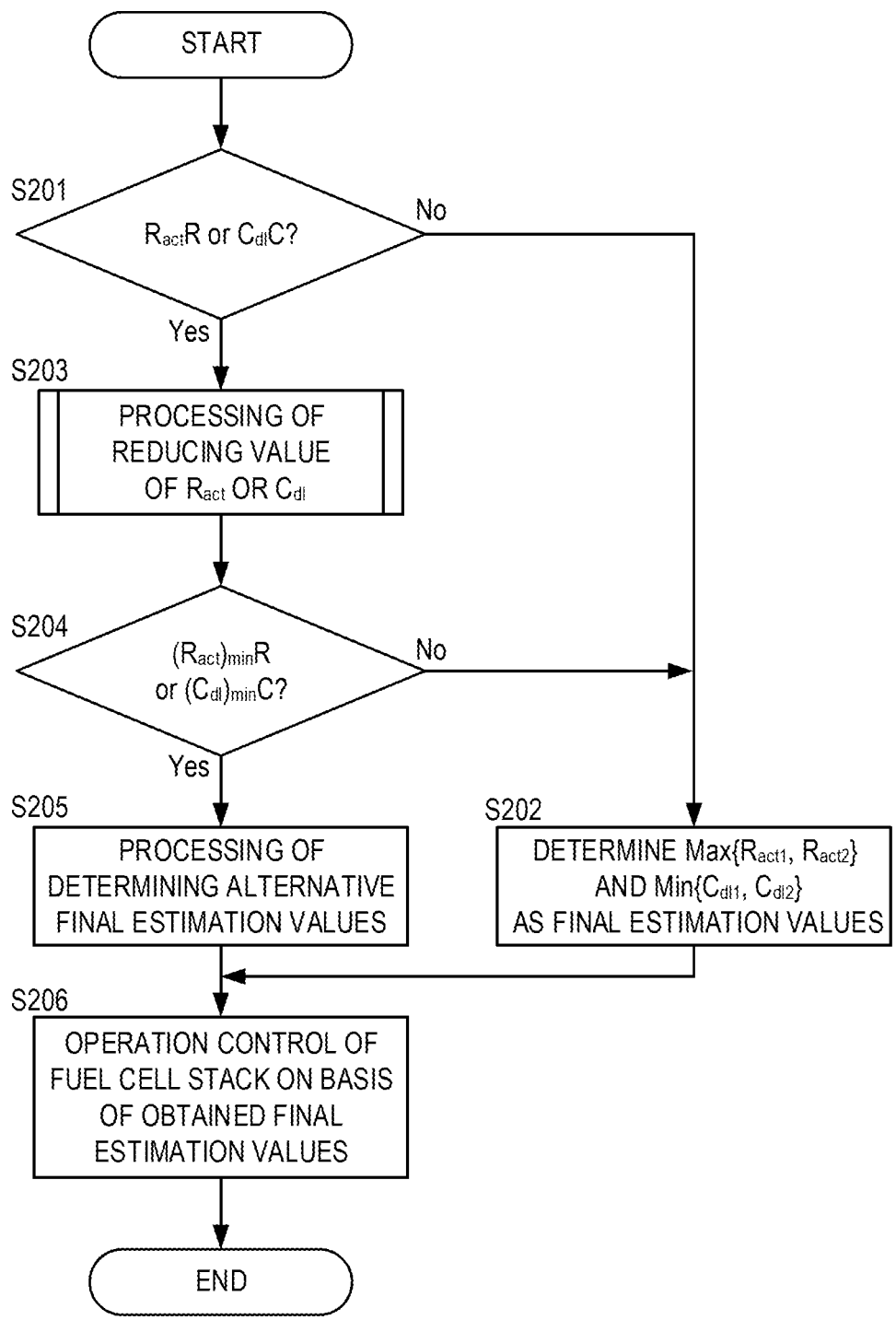
FIG. 9 is a flow chart showing the flow of an operation control of a fuel cell stack according to a second embodiment.
Figure 10:
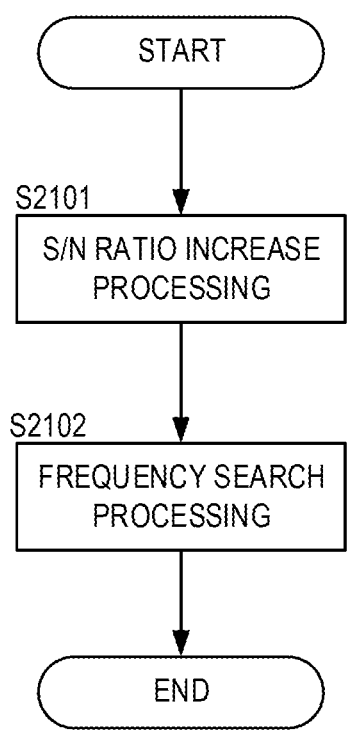
FIG. 10 is a flow chart showing the flow of a processing of reducing differences between first and second preliminary estimation values.

FIG. 9 is a flow chart showing the flow of the determination of the final estimation values of the fuel cell stack 1 and the operation control of the fuel cell stack 1 based on the final estimation values. FIG. 10 is a flow chart showing an auxiliary process, which is a part of the process shown in FIG. 9. It should be noted that each calculation in each of the following processes is performed using a central processing unit, a random access memory and the like equipped in a controller 6.

In Step S201, it is determined whether or not a difference $\Delta R_{act}(=|R_{act2}-R_{act1}|)$ between the aforementioned first and second preliminary estimation values $R_{act1}$, $R_{act2}$ based on internal impedances measured at an arbitrary internal impedance measurement timing is not smaller than a predetermined value $R\alpha$ or whether or not a difference $\Delta C_{dl}(=|C_{dl2}-C_{dl1}|)$ between the aforementioned first and second preliminary estimation values $C_{dl1}$, $C_{dl2}$ is not smaller than a predetermined value $C\alpha$. It should be noted that the predetermined values $R\alpha$, $C\alpha$ are threshold values appropriately determined in consideration of various elements such as the specifications of the fuel cell stack 1 and the number of laminations of cells.

Specifically, in this Step, it is determined whether or not the first and second preliminary estimation values $R_{act1}$, $R_{act2}$ of the reaction resistance and the first and second preliminary estimation values $C_{dl1}$, $C_{dl2}$ of the electrical double layer capacitance substantially match each other. If the first and second preliminary estimation values substantially match each other as described above ($\Delta R_{act}<R\alpha$ and $\Delta C_{dl}<C\alpha$), it is judged that the fuel cell stack 1 is normally estimated by the controller 6. Unless these match each other ($\Delta R_{act}\geq R\alpha$ or $\Delta C_{dl}\geq C\alpha$), it is judged that the fuel cell stack 1 is not normally estimated.

An example of a case where the state quantity of the fuel cell stack 1 cannot be normally estimated is cited below and it is described that the first and second preliminary estimation values do not substantially match each other in this case.

First, a case where the value $R_m$ of the electrolyte membrane resistance obtained by the above HFR measurement largely deviates from an actual value in the case of assuming the equivalent circuit model shown in FIG. 4 for the fuel cell stack 1 is cited as one case where the state quantity of the fuel cell stack 1 cannot be normally estimated.

If the second preliminary estimation values ($R_{act2}$, $C_{dl2}$) are calculated by substituting such an electrolyte membrane resistance $R_m$ deviating from the real value into Equation (3) as described in the above Step S1203, the calculation result of the second preliminary estimation values ($R_{act2}$, $C_{dl2}$) includes the influence of the value $R_m$ of the electrolyte membrane resistance deviating from the actual value and an error occurs.

On the other hand, since the term of the electrolyte membrane resistance $R_m$ is not included in Equation (2), the first preliminary estimation values ($R_{act1}$, $C_{dl1}$) calculated in accordance with this Equation (2) do not include the influence of the value $R_m$ of the electrolyte membrane resistance deviating from the actual value and precise values are maintained. Thus, it is thought that these precise first preliminary estimation values ($R_{act1}$, $C_{dl1}$) and second preliminary estimation values ($R_{act2}$, $C_{dl2}$) with the above error inevitably do not match.

Further, a case where the influence of a reactance component of an impedance measurement system such as the controller 6 is intensified to a non-negligible extent is cited as another case where the state quantity of the fuel cell stack 1 cannot be normally estimated. In this case, an equivalent circuit model of the fuel cell stack 1 approximates to a circuit model shown in FIG. 11, i.e. the assumed equivalent circuit model of FIG. 4 no longer holds. Thus, the final estimation value of the state quantity of the fuel cell stack 1 cannot be precisely obtained.

Figure 11:
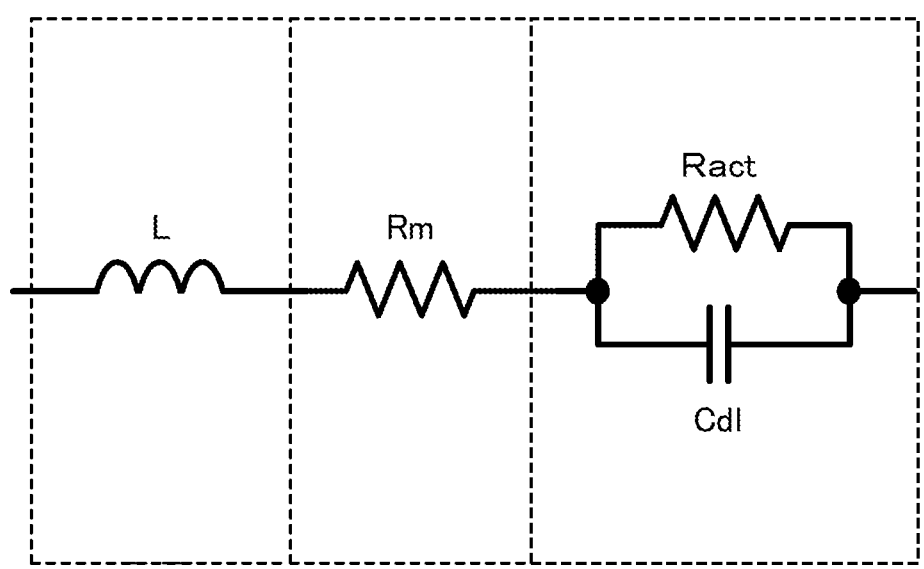
FIG. 11 shows an equivalent circuit of the fuel cell stack taking into consideration of a reactance component of a measurement system.

In this case, an equation determined by the internal impedance calculated on the basis of the equivalent circuit model shown in FIG. 11 is expressed as follows.

[Equation 4]

$$Z = R_m + j\omega L + \frac{R_{act}(1 - j\omega C_{dl}R_{act})}{1 + \omega^2 C_{dl}^2 R_{act}^2} \quad (4)$$

Where L denotes the value of the reactance of the impedance measurement system. Thus, if imaginary components of both sides of Equation (4) are taken and changed, the following equation is obtained.

[Equation 5]

$$-\frac{1}{\omega(Z_{im} - \omega L)} = \frac{1}{\omega^2 C_{dl1} R_{act1}^2} + C_{dl1} \quad (5)$$

Accordingly, if the estimation value $R_{act}$ of the reaction resistance and the estimation value $C_{dl}$ of the electrical double layer capacitance are obtained using the imaginary components $Z_{im1}$ and $Z_{im2}$ of the measurement values of the internal impedances in accordance with Equation (5), assuming that the reactance value L is known, these values include the influence of this reactance value L and, thus, deviate from the first preliminary estimation values ($R_{act1}$, $C_{act1}$) calculated from Equation (2) based on the equivalent circuit model of FIG. 4.

On the other hand, since the term of the reactance value L is a pure imaginary component as is clear with reference to Equation (4) described above, if real components of both sides in Equation (4) are taken, the term of this reactance L does not remain. Thus, an equation obtained by taking the real components of Equation (4) matches the above equation (3), wherefore the second preliminary estimation values ($R_{act2}$, $C_{act2}$) originally calculated on the basis of Equation (3) remain unchanged. In this way, if the influence of the reactance value of the impedance measurement system cannot be ignored, it is thought that the first preliminary estimation values ($R_{act1}$, $C_{act1}$) and the second preliminary estimation values ($R_{act2}$, $C_{act2}$) do not match.

Subsequently, in Step S202, it is judged that the state of the fuel cell stack 1 can be normally estimated if it is determined in Step S201 that $\Delta R_{act}$ is smaller than the predetermined value Rα and $\Delta C_{dl}$ is smaller than the predetermined value Ca. In this case, as in the case of Step S107 described above, Max$\{R_{act1}, R_{act2}\}$ based on the first preliminary estimation value $R_{act1}$ and the second preliminary estimation value $R_{act2}$ and Min$\{C_{dl1}, C_{dl2}\}$ based on the first preliminary estimation value $C_{dl1}$ and the second preliminary estimation value $C_{dl2}$ are respectively determined as the final estimation value $R_{actf}$ of the reaction resistance and the final estimation value Calf of the electrical double layer capacitance and a transition is made to a processing of Step S206 to be described later.

On the other hand, in Step S203, a processing of reducing the value of $\Delta R_{act}$ or $\Delta C_{dl}$ is performed if it is determined in Step S201 that $\Delta R_{act}$ is not smaller than the predetermined value Rα or $\Delta C_{dl}$ is not smaller than the predetermined value Cα. This is specifically a processing of trying a correction to enable a normal estimation when the state of the fuel cell stack 1 cannot be normally estimated since the first preliminary estimation value $R_{act1}$ and the second preliminary estimation value $R_{act2}$ do not substantially match or the first preliminary estimation value $C_{dl1}$ and the second preliminary estimation value $C_{dl2}$ do not substantially match. This processing is described in detail below.

In FIG. 10, the flow of the processing of reducing the value of $\Delta R_{act}$ or $\Delta C_{dl}$ is shown in the flow chart.

First, in Step S2101, an S/N ratio increase processing is performed. Specifically, the controller 6 performs a processing of adjusting an output current by increasing amplitudes of the voltages $V_{in1}$ and $V_{in2}$ applied to the fuel cell stack 1 during the internal impedance measurement so as to facilitate the distinction of output current information from noise.

It should be noted that an S/N ratio according to the present embodiment is defined as a value obtained by dividing an effective value of an output current $I_{out}$ measured by a current sensor 51 by an effective value of a noise current to be measured. Further, a known noise measurement device can be used as a device for measuring this noise current.

Figure 12:
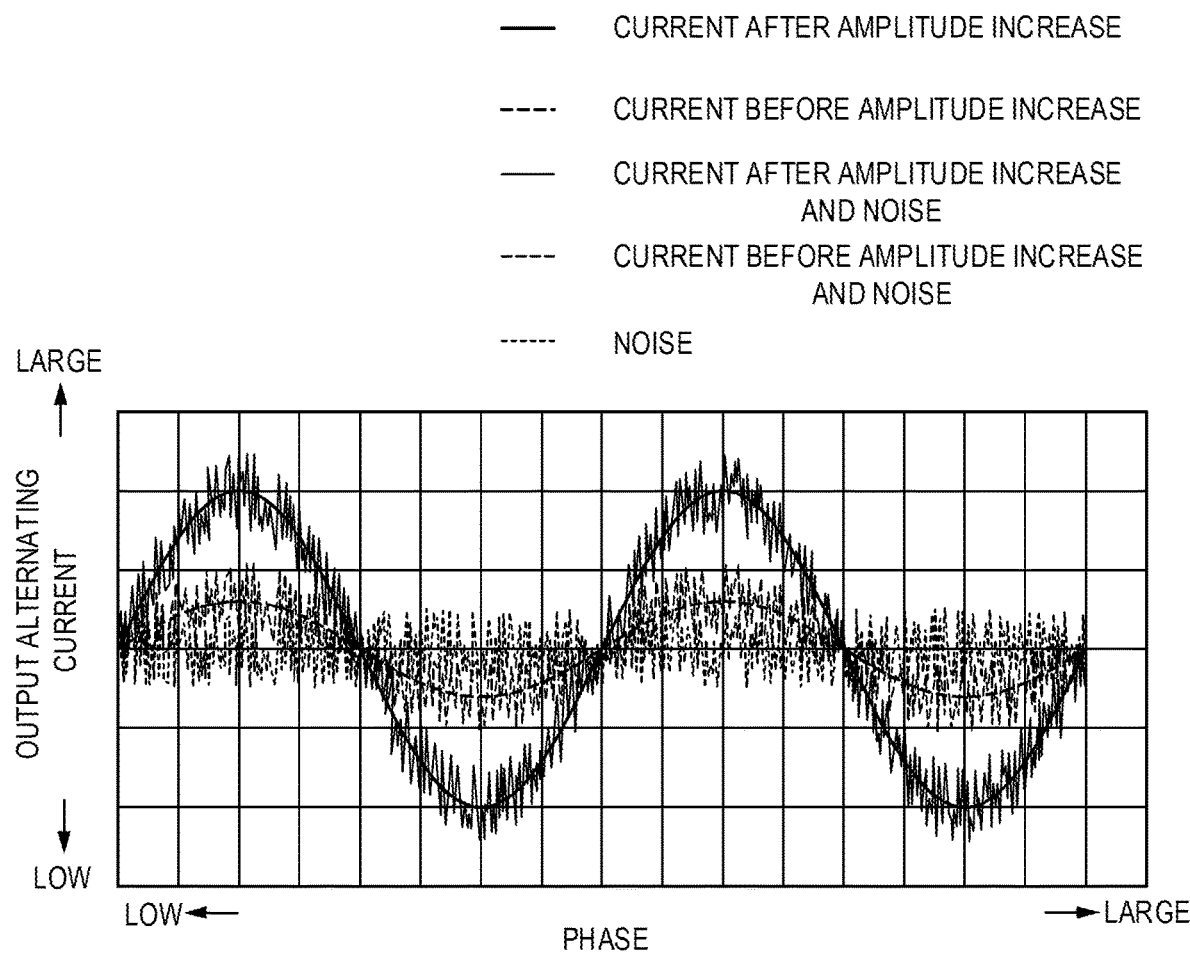
FIG. 12 shows modes of an output current with noise in the case of performing an S/N ratio increase processing and an output current with noise in the case of not performing this processing.

Modes of the output current $I_{out}$ in the case of performing the processing of increasing the amplitude of the applied voltage $V_{in}$ and the output current $I_{out}$ in the case of not performing this processing are shown in FIG. 12. In FIG. 12, the output current and the noise before the S/N increase processing are performed are shown in broken line and the output current and the noise after the S/N increase processing are performed are shown in solid line. Further, only the noise is shown in relatively thin broken line. As is clear from FIG. 12, since the noise is relatively large in the output current having a relatively small amplitude before the above processing, it is difficult to obtain the output current information.

On the other hand, after the processing of increasing the amplitude of the applied voltage $V_{in}$ is performed, the amplitude of the output current increases and the noise becomes relatively small. Thus, it becomes easier to obtain the output current information. However, the processing of increasing the amplitude of the applied voltage $V_{in}$ is preferably performed to adjust the consumption of hydrogen in the anode electrode 113 due to an increase of the output current $I_{out}$ to such an extent that the consumption does not become excessively large. It should be noted that this S/N ratio increase processing (S2101) may be omitted if necessary and only the next frequency search processing (S2102) may be performed.

Subsequently, a processing of searching the value of such a frequency ω to minimize the values of $\Delta R_{act}$ and $\Delta C_{dl}$ is performed in Step S2102. Specifically, the values of the frequencies $\omega_1$, $\omega_2$ at the voltages $V_{in1}$ and $V_{in2}$ caused to be applied to the fuel cell stack 1 from the alternating-current power supply 57 by the controller 6 are continuously varied in a predetermined range and the values of $\Delta R_{act}$ and $\Delta C_{dl}$ corresponding to these varied frequencies are obtained. When the values of $\Delta R_{act}$ and $\Delta C_{dl}$ are minimized, the values of the frequencies $\omega_1$, $\omega_2$ and the values of $\Delta R_{act}$ and $\Delta C_{dl}$ at this time are recorded. It should be noted that the range in which the values of the frequencies $\omega_1$, $\omega_2$ are varied is not particularly limited, but it is preferable to vary the frequencies in a range of several Hz to several kHz in which the equivalent circuit model shown in FIG. 4 is thought to match well the actual fuel cell stack 1.

Here, in some cases, the reactance component of the impedance measurement system as shown in FIG. 11 strongly influences and the values of $\Delta R_{act}$ and $\Delta C_{dl}$ become large, for example, at a certain frequency, whereas the influence of this reactance component can be ignored at another frequency, with the result that the actual fuel cell stack 1 may match well the equivalent circuit model shown in FIG. 4.

Accordingly, by finding out a frequency at which the aforementioned values of $\Delta R_{act}$ and $\Delta C_{dl}$ are minimized by this frequency search processing and conducting the internal impedance measurement employing such a frequency, it is possible, as a result, to reduce the values of $\Delta R_{act}$ and $\Delta C_{dl}$ and causing the actual fuel cell stack 1 to match well the equivalent circuit model shown in FIG. 4.

The frequencies $\omega_1$, $\omega_2$ at which the values of $\Delta R_{act}$ and $\Delta C_{dl}$ are minimized are respectively written as $(\omega_1)_{min}$ and $(\omega_2)_{min}$ and $\Delta R_{act}$ and $\Delta C_{dl}$ at this time are respectively written as $(\Delta R_{act})_{min}$ and $(\Delta C_{dl})_{min}$.

Referring back to FIG. 9, it is determined in Step S204, whether $(\Delta R_{act})_{min}$ described above is not smaller than the predetermined value $R\alpha$ or $(\Delta C_{dl})_{min}$ is not smaller than the predetermined value $C\alpha$. Specifically, it is determined whether or not $(\Delta R_{act})_{min}$ and $(\Delta C_{dl})_{min}$ after the processing of reducing the values of $\Delta R_{act}$ and $\Delta C_{dl}$ have been reduced to such an extent that the state of the fuel cell stack 1 can be normally estimated.

Here, if it is determined that $(\Delta R_{act})_{min}$ is smaller than the predetermined value $R\alpha$ and $(\Delta C_{dl})_{min}$ is smaller than the predetermined value $C\alpha$, it is judged that the state of the fuel cell stack 1 can be normally estimated and an advance is made to Step S202 described above to determine Max{$R_{act1}$, $R_{act2}$} and Min{$C_{dl1}$, $C_{dl2}$} obtained on the basis of $(\omega_1)_{min}$ and $(\omega_2)_{min}$ described above as the final estimation value $R_{actf}$ of the reaction resistance and the final estimation value $C_{dlf}$ of the electrical double layer capacitance.

On the other hand, if it is determined that $(\Delta R_{act})_{min}$ is not smaller than the predetermined value $R\alpha$ or $(\Delta C_{dl})_{min}$ is not smaller than the predetermined value $C\alpha$, it is judged in Step S205 that the state of the fuel cell stack 1 cannot be normally estimated and an alternative final estimation value determination processing is performed.

Specifically, in an exception determination processing of the final estimation values, the final estimation values ($R_{actf}$, $C_{dlf}$) determined in the previous measurement (e.g. last measurement) in which $\Delta R_{act}$ is smaller than the predetermined value $R\alpha$ and $\Delta C_{dl}$ is smaller than the predetermined value $C\alpha$ are determined as alternative final estimation values ($R'_{actf}$, $C'_{dlf}$).

It should be noted that the final estimation values in the aforementioned previous measurement may be stored in predetermined storage means equipped in the controller 6 or the like and the alternative final estimation values ($R_{actf}$, $C_{dlf}$) may be read from this storage means as the alternative final estimation values ($R'_{actf}$, $C'_{dlf}$) in order to enable the alternative final estimation values ($R'_{actf}$, $C'_{dlf}$) to be smoothly determined.

Further, instead of the method using the final estimation values in the previous measurement preceding the measurement this time, predetermined values may be determined as the alternative final estimation values ($R'_{actf}$, $C'_{dlf}$). In this case, it is preferable to set these values at conservative values with a margin in consideration of safety and other factors.

Subsequently, in Step S206, the controller 6 executes the operation control of the fuel cell stack 1 on the basis of the final estimation values ($R_{actf}$, $C_{dlf}$) or the alternative final estimation values ($R'_{actf}$, $C'_{dlf}$) determined in Step S202 or Step S205 described above.

Specifically, the controller 6 adjusts the value of target output power to be supplied to a travel motor 53 or the like serving as a load while grasping a capacity and a degree of deterioration of the fuel cell stack 1 on the basis of these final estimation values ($R_{actf}$, $C_{dlf}$) or alternative final estimation values ($R'_{actf}$, $C'_{dlf}$).

According to the controller 6 (state estimation device) of the present embodiment described above and the fuel cell system 100 including this controller, the following effects can be obtained.

The controller 6 according to the present embodiment further has a fuel cell abnormal state determination function of judging that the fuel cell stack 1 is not normally operated if the differences between the first preliminary estimation values ($R_{act1}$, $C_{dl1}$) and the second preliminary estimation values ($R_{act2}$, $C_{dl2}$) are not smaller than the predetermined values. In this way, a case where the state of the fuel cell stack 1 cannot be normally estimated can be properly judged.

The controller 6 according to the present embodiment further has a function serving as fuel cell normal state determination unit configured to judge that the fuel cell stack 1 is normally estimated when the differences between the first preliminary estimation values ($R_{act1}$, $C_{dl1}$) and the second preliminary estimation values ($R_{act2}$, $C_{dl2}$) are smaller than the predetermined values. In this way, a case where the state of the fuel cell stack 1 can be normally estimated can be properly judged.

Here, objective grounds for possible judgment on whether or not the fuel cell stack 1 can be normally estimated depending on whether or not the first preliminary estimation values ($R_{act1}$, $C_{dl1}$) and the second preliminary estimation values ($R_{act2}$, $C_{dl2}$) substantially match are described below.

Figure 13:
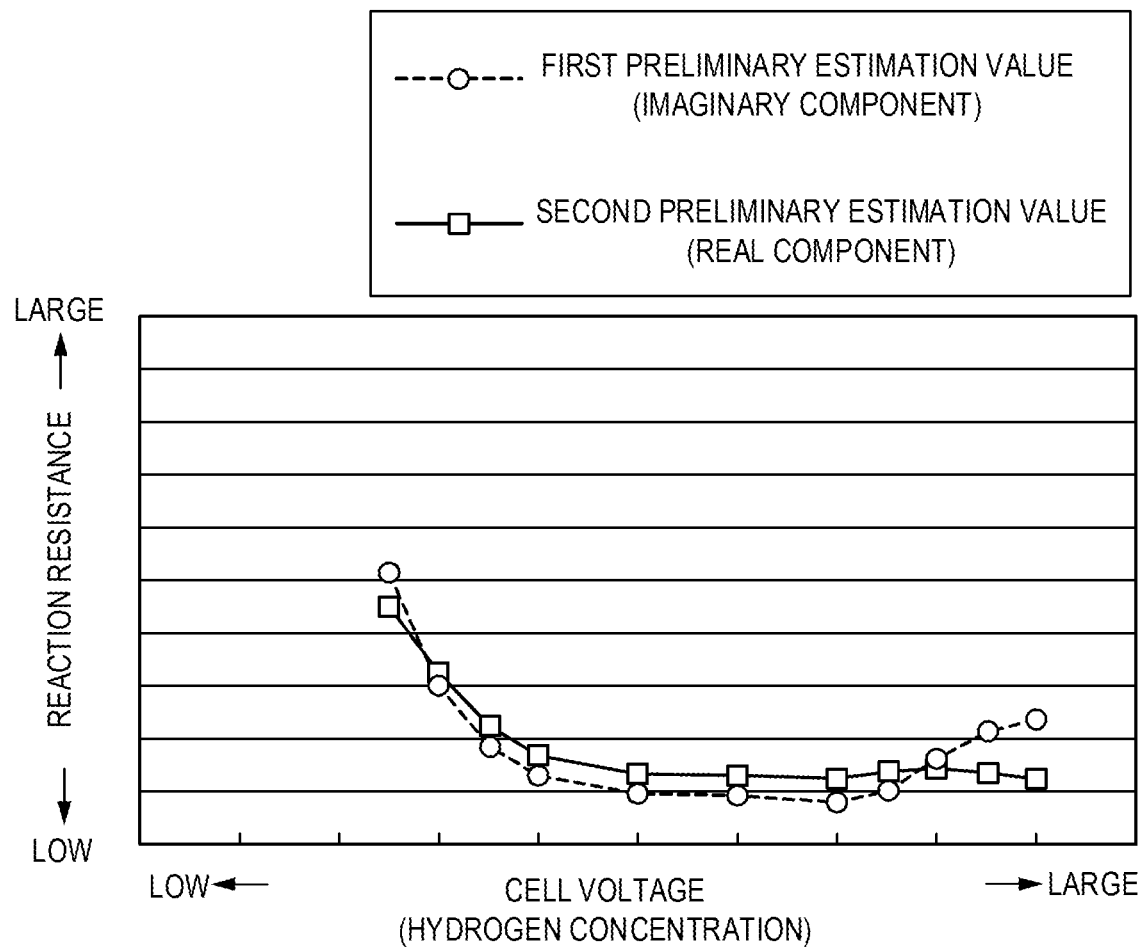
FIG. 13 is a graph showing a relationship of a cell voltage of the fuel cell stack and the first and second preliminary estimation values $R_{act1}$ and $R_{act2}$ of a reaction resistance.

FIG. 13 is a graph showing a relationship of a cell voltage, the first preliminary estimation value $R_{act1}$ and the second preliminary estimation value $R_{act2}$. It should be noted that the frequencies $\omega_1$, $\omega_2$ used in the internal impedance measurement for the calculation of the first preliminary estimation values $R_{act1}$ and the second preliminary estimation value $R_{act2}$ in this graph are frequencies included in a specific frequency band, for example, near 15 Hz. Further, the magnitude of the cell voltage in FIG. 13 corresponds to the magnitude of the hydrogen concentration in the catalyst layer 112 of the anode electrode 112. Further, a sufficient S/N ratio is ensured here.

As is clear from FIG. 13, the first preliminary estimation value $R_{act1}$ and the second preliminary estimation value $R_{act2}$ substantially match each other regardless of the magnitude of the cell voltage. On the other hand, it is known that the actual fuel cell stack 1 matches the equivalent circuit model shown in FIG. 4 at the above frequencies $\omega_1$, $\omega_2$ included in the above specific frequency band. Thus, in this case, the accuracy of the final estimation values ($R_{actf}$, $C_{dlf}$) determined on the basis of the equivalent circuit model of FIG. 4 is maintained high. As a result, if these final estimation values ($R_{actf}$, $C_{dlf}$) are used, it is thought to be possible to normally estimate the state of the fuel cell stack 1.

From this reason, it is found that the matching of the first preliminary estimation value $R_{act1}$ and the second preliminary estimation value $R_{act2}$ and the possibility to normally estimate the fuel cell stack 1 are correlated.

It should be noted that the above specific frequency band is appropriately determined in the light of various conditions such as measurement conditions and the configuration of the fuel cell stack 1. However, if the frequency for the internal impedance measurement is too high, the reactance component of the aforementioned impedance measurement system cannot be ignored and the equivalent circuit model shown in FIG. 4 and the actual fuel cell stack 1 do not match in properties. Thus, the above specific frequency band is generally assumed to be from several Hz to several kHz, particularly from several Hz to several hundreds of Hz and more particularly from several Hz to several tens of Hz.

Further, as described in Step S201 and Step S2102 described above, the controller 6 varies the frequencies ($\omega_1$, $\omega_2$) of the alternating-current signals ($V_{in1}$, $V_{in2}$) applied for the internal impedance measurement in order to reduce the differences ($\Delta R_{act}$ and $\Delta C_{dl}$) between the first preliminary estimation values ($R_{act1}$, $C_{dl1}$) and the second preliminary estimation values ($R_{act2}$, $C_{dl2}$) when the differences between the first preliminary estimation values ($R_{act1}$, $C_{dl1}$) and the second preliminary estimation values ($R_{act2}$, $C_{dl2}$) are not smaller than the predetermined values ($R\alpha$, $C\alpha$).

According to this, when a certain abnormality occurs in the fuel cell stack 1, the assumed equivalent circuit model no longer matches the actual fuel cell stack 1 and the state of the fuel cell stack 1 can be no longer normally estimated, it is possible to find out the frequencies at which the above assumed equivalent circuit model can be used by varying the values of the frequencies ($\omega_1$, $\omega_2$) of the alternating-current signals ($V_{in1}$, $V_{in2}$) and searching the frequencies of reducing the above differences ($\Delta R_{act}$ and $\Delta C_{dl}$). Thus, by using these found-out frequencies in the internal impedance measurement, highly accurate final estimation values ($R_{actf}$, $C_{dlf}$) can be obtained, which contributes to the normal estimation of the state of the fuel cell stack 1.

Further, as described in Step S201 and Step S2101 described above, the controller 6 may increase the amplitude values of the alternating-current signals ($V_{in1}$, $V_{in2}$) applied for the internal impedance measurement to reduce the differences ($\Delta R_{act}$ and $\Delta C_{dl}$) between the first preliminary estimation values ($R_{act1}$, $C_{dl1}$) and the second preliminary estimation values ($R_{act2}$, $C_{dl2}$) when the differences between the first preliminary estimation values ($R_{act1}$, $C_{dl1}$) and the second preliminary estimation values ($R_{act2}$, $C_{dl2}$) are not smaller than the predetermined values ($R\alpha$, $C\alpha$).

According to this, when the state of the fuel cell stack 1 can be no longer normally estimated, the S/N ratio is easily ensured by increasing the amplitude values of the alternating-current signals ($V_{in1}$, $V_{in2}$) applied for the internal impedance measurement. Thus, clearer information of output signals ($I_{in1}$, $I_{in2}$) can be obtained, which contributes to an improvement of measurement accuracy.

Further, as described in Step S205 described above, the controller 6 may further have a function serving as fuel cell operation control unit configured to determine the final estimation values based on the previous internal impedance measurement values when the differences ($\Delta R_{act}$ and $\Delta C_{dl}$) between the first preliminary estimation values ($R_{act1}$, $C_{dl1}$) and the second preliminary estimation values ($R_{act2}$, $C_{dl2}$) were smaller than the predetermined values ($R\alpha$, $C\alpha$) as the alternative final estimation values ($R'_{actf}$, $C'_{dlf}$) if the differences (($\Delta R_{act})_{min}$, $(\Delta C_{dl})_{min}$) between the first preliminary estimation values ($R_{act1}$, $C_{dl1}$) and the second preliminary estimation values ($R_{act2}$, $C_{dl2}$) are not reduced to become smaller than the predetermined values ($R\alpha$, $C\alpha$) by changes of the values of the frequencies ($\omega_1$, $\omega_2$) and/or increases of the amplitude values of the alternating-current signals ($V_{in1}$, $V_{in2}$) to be applied, and execute the operation control of the fuel cell stack 1 on the basis of the determined alternative final estimation values ($R'_{actf}$, $C'_{dlf}$).

According to this, if the first preliminary estimation values ($R_{act1}$, $C_{dl1}$) and the second preliminary estimation values ($R_{act2}$, $C_{dl2}$) substantially deviate from each other, the final estimation values in the measurement prior to the mutual deviation of these preliminary estimation values are set as the alternative final estimation values ($R'_{actf}$, $C'_{dlf}$), assuming that the reliability of the final estimation values ($R_{actf}$, $C_{dlf}$) determined by calculating these first and second preliminary estimation values has been reduced. Thus, it is possible to prevent the operation control of the fuel cell stack 1 using parameters with reduced reliability. It should be noted that the final estimation values stored during the one previous measurement prior to the one during which it is judged that the state of the fuel cell stack 1 cannot be normally determined are preferably determined as the alternative final estimation values ($R'_{actf}$, $C'_{dlf}$).

Further, as described in Step S205 described above, the controller 6 functions as the fuel cell operation control unit configured to determine values determined in advance as the alternative final estimation values ($R'_{actf}$, $C'_{dlf}$) if the differences (($\Delta R_{act})_{min}$, $(\Delta C_{dl})_{min}$) between the first preliminary estimation values ($R_{act1}$, $C_{dl1}$) and the second preliminary estimation values ($R_{act2}$, $C_{dl2}$) are not reduced to become smaller than the predetermined values ($R\alpha$, $C\alpha$) by changes of the values of the frequencies ($\omega_1$, $\omega_2$) and/or increases of the amplitude values of the alternating-current signals ($V_{in1}$, $V_{in2}$) to be applied, and execute the operation control of the fuel cell stack 1 on the basis of the determined alternative final estimation values ($R'_{actf}$, $C'_{dlf}$).

In this way, even if the state of the fuel cell stack 1 can be no longer normally estimated because the first preliminary estimation values ($R_{act1}$, $C_{dl1}$) and the second preliminary estimation values ($R_{act2}$, $C_{dl2}$) substantially deviate from each other, the operation control of the fuel cell stack 1 can be continued using the values determined in advance as the alternative final estimation values ($R'_{actf}$, $C'_{dlf}$). It should be noted that, in this case, these values are desirably set at conservative values with a margin in safety aspect in consideration of safety and other factors.

Although the embodiments of the present invention have been described above, the above embodiments are merely an illustration of some application examples of the present invention and not intended to limit the technical scope of the present invention to the specific configurations of the above embodiments.

For example, although the configuration of the present invention is applied to the fuel cell stack 1 for supplying drive power to the travel motor 53 of the vehicle in the above embodiments, there is no limitation to this and the configuration of the present invention can be applied to arbitrary fuel cells used to supply power to load elements, for example, in personal computers, other vehicles and the like.

Further, various changes can be made in a circuit configuration and the like for measuring the internal impedance Z. For example, in the present embodiments, the alternating-current power supply 57 is caused to apply a voltage to the fuel cell stack 1, an output alternating current is measured and an internal impedance is calculated on the basis of the applied voltage and the output alternating current. However, a predetermined current source may be caused to supply an alternating current to the fuel cell stack 1, an output alternating-current voltage may be measured and an internal impedance may be calculated on the basis of the alternating current and the output alternating-current voltage.

Furthermore, although the first preliminary estimation values ($R_{act1}$, $C_{dl1}$) and the second preliminary estimation values ($R_{act2}$, $C_{dl2}$) for the reaction resistance and the electric double layer capacitance of the cathode electrode 113 are obtained in the above embodiments, there is no limitation to this. For example, first preliminary estimation values and second preliminary estimation values for the reaction resistance and the electric double layer capacitance of the anode electrode 112 may be obtained, for example, when a so-called hydrogen starvation state where an anode gas concentration in the anode gas flow passages is insufficient is present and a state quantity such as a reaction resistance on the side of the anode electrode 112 is large to a non-negligible extent.

The invention claimed is:

1. A state estimation device for a fuel cell for generating power upon receiving supply of anode gas and cathode gas, comprising
a processor programmed to:
measure an internal impedance of the fuel cell on the basis of an alternating-current signal of a predetermined frequency output from the fuel cell;
calculate first preliminary estimation values of a reaction resistance and an electrical double layer capacitance of an electrode obtained from an imaginary component of a measurement value of the internal impedance on the basis of an equation for an imaginary component of the internal impedance, the equation being determined by an equivalent circuit model of the fuel cell;
calculate second preliminary estimation values of the reaction resistance and the electrical double layer capacitance of the electrode obtained from a real component of the measurement value of the internal impedance on the basis of an equation for a real component of the internal impedance;
determine a final estimation value of the reaction resistance of the electrode on the basis of the calculated first and second preliminary estimation values of the reaction resistance;
determine a final estimation value of the electrical double layer capacitance on the basis of the calculated first and second preliminary estimation values of the electrical double layer capacitance; and
detect an abnormal state of the fuel cell on the basis of the final estimation value of the reaction resistance and/or the final estimation value of the electrical double layer capacitance.

2. The state estimation device for the fuel cell according to claim 1, wherein:
the processor is programmed to determine a larger one of the first and second preliminary estimation values of the reaction resistance as a final estimation value of the reaction resistance.

3. The state estimation device for the fuel cell according to claim 1, wherein:
the processor is programmed to:
obtain a first preliminary estimation value $R_{act1}$ of the reaction resistance using frequencies $\omega_1$, $\omega_2$ and measurement values $Z_{im1}$ and $Z_{im2}$ of imaginary components of internal impedances corresponding to respective frequencies $\omega_1$, $\omega_2$ on the basis of the following equation for an imaginary component $Z_{im}$ of the internal impedance determined by an equivalent circuit model of the fuel cell:

[Equation 1]

$$-\frac{1}{\omega Z_{im}} = \frac{1}{\omega^2 C_{dl1} R_{act1}^2} + C_{dl1}$$

where $Z_{im}$ denotes the imaginary component of the internal impedance of the fuel cell and $\omega$ denotes an angular frequency of the alternating-current signal, and $C_{dl1}$ denotes a first preliminary estimation value of the electrical double layer capacitance; and obtain a second preliminary estimation value $R_{act2}$ of the reaction resistance using the frequencies $\omega_1$, $\omega_2$, measurement values $Z_{re1}$ and $Z_{re2}$ of real components of the internal impedances corresponding to the respective frequencies $\omega_1$, $\omega_2$ and an electrolyte membrane resistance $R_m$ calculated in advance on the basis of the following equation for a real component $Z_{re}$ of the internal impedance determined by the equivalent circuit model of the fuel cell:

[Equation 2]

$$\frac{1}{Z_{re} - R_m} = \omega^2 C_{dl2}^2 R_{act2} + \frac{1}{R_{act2}}$$

where $C_{dl2}$ denotes a second preliminary estimation value of the electrical double layer capacitance.

4. The state estimation device for the fuel cell according to claim 3, wherein:
the first preliminary estimation value $R_{act1}$ of the reaction resistance is obtained on the basis of a gradient and an intercept of a straight line obtained by connecting two points plotted on a coordinate system with $1/\omega^2$ represented on a horizontal axis and $-1/(\omega \cdot Z_{im})$ represented on a vertical axis, using the frequencies $\omega_1$, $\omega_2$ and the measurement values $Z_{im1}$ and $Z_{im2}$ of the imaginary components of the internal impedances; and
the second preliminary estimation value $R_{act2}$ of the reaction resistance is obtained on the basis of an intercept of a straight line obtained by connecting two points plotted on a coordinate system with $\omega^2$ represented on a horizontal axis and $1/(Z_{re}-R_m)$ represented on a vertical axis, using the frequencies $\omega_1$, $\omega_2$, the measurement values $Z_{re1}$ and $Z_{re2}$ of the real components of the internal impedances and the electrolyte membrane resistance $R_m$ calculated in advance.

5. The state estimation device for the fuel cell according to claim 1, wherein:
the processor is programmed to determine a smaller one of the first and second preliminary estimation values of the electrical double layer capacitance as a final estimation value of the electrical double layer capacitance.

6. The state estimation device for the fuel cell according to claim 5, wherein:
the processor is programmed to:
obtain a first preliminary estimation value Can of the electrical double layer capacitance using frequencies $\omega_1$, $\omega_2$ and measurement values $Z_{im1}$ and $Z_{im2}$ of imaginary components of internal impedances corresponding to the respective frequencies $\omega_1$, $\omega_2$ on the basis of the following equation for an imaginary component $Z_{im}$ of the internal impedance determined by an equivalent circuit model of the fuel cell:

[Equation 3]

$$-\frac{1}{\omega Z_{im}} = \frac{1}{\omega^2 C_{dl1} R_{act1}^2} + C_{dl1}$$

where $Z_{im}$ denotes the imaginary component of the internal impedance of the fuel cell and $\omega$ denotes an angular frequency of the alternating-current signal, and $R_{act1}$ denotes a first preliminary estimation value of the reaction resistance; and obtain a second preliminary estimation value $C_{dl2}$ of the electrical double layer capacitance using the frequencies $\omega_1$, $\omega_2$, measurement values $Z_{re1}$ and $Z_{re2}$ of real components of the internal impedances corresponding to the respective frequencies $\omega_1$, $\omega_2$ and an electrolyte membrane resistance $R_m$ calculated in advance on the basis of the following equation for a real component $Z_{re}$ of the internal impedance determined by the equivalent circuit model of the fuel cell:

[Equation 4]

$$\frac{1}{Z_{re} - R_m} = \omega^2 C_{dl2}^2 R_{act2} + \frac{1}{R_{act2}}$$

where $R_{act2}$ denotes a second preliminary estimation value of the reaction resistance.

7. The state estimation device for the fuel cell according to claim 6, wherein:
the first preliminary estimation value Can of the electrical double layer capacitance is obtained on the basis of an intercept of a straight line obtained by connecting two points plotted on a coordinate system with $1/\omega^2$ represented on a horizontal axis and $-1/(\omega \cdot Z_{im})$ represented on a vertical axis, using the frequencies $\omega_1$, $\omega_2$ and the measurement values $Z_{im1}$ and $Z_{im2}$ of the imaginary components of the internal impedances; and
the second preliminary estimation value $C_{dl2}$ of the electrical double layer capacitance is obtained on the basis of a gradient and an intercept of a straight line obtained by connecting two points plotted on a coordinate system with $\omega^2$ represented on a horizontal axis and $1/(Z_{re}-R_m)$ represented on a vertical axis, using the frequencies $\omega_1$, $\omega_2$, the measurement values $Z_{re1}$ and $Z_{re2}$ of the real components of the internal impedances and the electrolyte membrane resistance $R_m$ calculated in advance.

8. The state estimation device for the fuel cell according to claim 1, wherein:
the processor is further programmed to judge that a state of the fuel cell is not normally estimated if a difference between the first and second preliminary estimation values is not smaller than a predetermined value.

9. The state estimation device for the fuel cell according to claim 1, wherein:
the processor is further programmed to judge that a state of the fuel cell is normally estimated if a difference between the first and second preliminary estimation values is smaller than a predetermined value.

10. The state estimation device for the fuel cell according to claim 8, wherein:
the processor is programmed to vary the value of a frequency of an alternating-current signal to be applied for the internal impedance measurement to reduce the difference between the first and second preliminary estimation values when the difference between the first and second preliminary estimation values is not smaller than the predetermined value.

11. The state estimation device for the fuel cell according to claim 8, wherein:
the processor is programmed to increase an amplitude value of the alternating-current signal to be applied for the internal impedance measurement to reduce the difference between the first and second preliminary estimation values when the difference between the first and second preliminary estimation values is not smaller than the predetermined value.

12. A fuel cell system using the state estimation device for the fuel cell according to claim 8, wherein:
the processor is programmed to:
determine the final estimation value based on a previous internal impedance measurement value when the difference between the first and second preliminary estimation values was determined to be smaller than the predetermined value as an alternative final estimation value if the difference between the first and second preliminary estimation values is not reduced to become smaller than the predetermined value by a change of the value of the frequency and/or an increase of an amplitude value of the alternating-current signal to be applied; and
execute an operation control of the fuel cell on the basis of the determined alternative final estimation value.

13. A fuel cell system using the state estimation device for the fuel cell according to claim 8, wherein:
the processor is programmed to:
determine a value determined in advance as an alternative final estimation value if the difference between the first and second preliminary estimation values is not reduced to become smaller than the predetermined value by a change of the value of the frequency and/or an increase of an amplitude value of the alternating-current signal to be applied for the internal impedance measurement; and
execute an operation control of the fuel cell on the basis of the determined alternative final estimation value.

14. A state estimation method for a fuel cell for generating power upon receiving supply of anode gas and cathode gas, comprising:
measuring, by a processor, an internal impedance of the fuel cell on the basis of an alternating-current signal of a predetermined frequency output from the fuel cell;
calculating, by the processor, first preliminary estimation values of a reaction resistance and an electrical double layer capacitance of an electrode obtained from an imaginary component of a measurement value of the internal impedance on the basis of an equation for an imaginary component of the internal impedance, the equation being determined by an equivalent circuit model of the fuel cell;
calculating, by the processor, second preliminary estimation values of the reaction resistance and the electrical double layer capacitance of the electrode obtained from a real component of the measurement value of the internal impedance on the basis of an equation for a real component of the internal impedance;
determining, by the processor, a final estimation value of the reaction resistance of the electrode on the basis of the calculated first and second preliminary estimation values of the reaction resistance;
determining, by the processor, a final estimation value of the electrical double layer capacitance on the basis of the calculated first and second preliminary estimation values of the electrical double layer capacitance; and
detecting an abnormal state of the fuel cell on the basis of the final estimation value of the reaction resistance and/or the final estimation value of the electrical double layer capacitance.

15. A state estimation device for a fuel cell for generating power upon receiving supply of anode gas and cathode gas, comprising
a processor programmed to:
measure an internal impedance of the fuel cell on the basis of an alternating-current signal of a predetermined frequency output from the fuel cell;
calculate first preliminary estimation values of a reaction resistance and an electrical double layer capacitance of an electrode obtained from an imaginary component of a measurement value of the internal impedance on the basis of an equation for an imaginary component of the internal impedance, the equation being determined by an equivalent circuit model of the fuel cell;
calculate second preliminary estimation values of the reaction resistance and the electrical double layer capacitance of the electrode obtained from a real component of the measurement value of the internal impedance on the basis of an equation for a real component of the internal impedance;
determine a final estimation value of the reaction resistance of the electrode on the basis of the calculated first and second preliminary estimation values of the reaction resistance;
determine a final estimation value of the electrical double layer capacitance on the basis of the calculated first and second preliminary estimation values of the electrical double layer capacitance; and
execute an operation control of the fuel cell on the basis of the final estimation value of the reaction resistance and/or the final estimation value of the electrical double layer capacitance.

* * * * *